United States Patent
Ayukawa et al.

(10) Patent No.: US 6,928,512 B2
(45) Date of Patent: Aug. 9, 2005

(54) SEMICONDUCTOR DEVICE WITH NON-VOLATILE MEMORY AND RANDOM ACCESS MEMORY

(75) Inventors: Kazushige Ayukawa, Kokubunji (JP); Seiji Miura, Hachioji (JP); Tetsuya Iwamura, Akiruno (JP); Kouichi Hoshi, Fussa (JP); Yoshikazu Saitou, Hamura (JP)

(73) Assignees: Hitachi ULSI Systems Co, Ltd., Tokyo (JP); Renesas Technology Corporation, Tokyo (JP)

( * ) Notice: Subject to any disclaimer, the term of this patent is extended or adjusted under 35 U.S.C. 154(b) by 155 days.

(21) Appl. No.: 10/163,364

(22) Filed: Jun. 6, 2002

(65) Prior Publication Data

US 2002/0199056 A1 Dec. 26, 2002

(30) Foreign Application Priority Data

Jun. 20, 2001  (JP) .................................. 2001-185771

(51) Int. Cl.[7] ..................... G06F 12/00; G11C 11/406
(52) U.S. Cl. ..................... 711/105; 711/106; 365/222
(58) Field of Search ............................... 711/105, 106, 711/101; 365/51–52, 63, 189.04, 222, 230.03

(56) References Cited

U.S. PATENT DOCUMENTS 5,627,791 A * 5/1997 Wright et al. .............. 365/222
6,392,950 B2 * 5/2002 Ayukawa et al. ....... 365/230.03

FOREIGN PATENT DOCUMENTS

| EP | 0 566 306 A2 | 4/1993 |
| JP | 8-305680 | 4/1995 |
| JP | 10-11348 | 6/1996 |
| JP | 11-204721 | 1/1998 |

OTHER PUBLICATIONS

Sharp Corporation, "LRS1337 Stacked Chip 32M Flash Memory and 4M SDRAM" Data Sheet, 1999, pp. 1–24.

* cited by examiner

Primary Examiner—Gary Portka
(74) Attorney, Agent, or Firm—Reed Smith LLP; Stanley P. Fisher, Esq.; Juan Carlos A. Marquez, Esq.

(57) ABSTRACT

A non-volatile memory, an SRAM, a DRAM and a control circuit are module-formed into a single packaged. The control circuit assigns addresses to the SRAM and addresses to the DRAM and data necessary to be held for a long period of time is saved in the SRAM. Two chips of DRAM are mapped to the same address space and refreshed alternately. The plural chips are arranged such that they are mutually laminated, and they are wired by means of a BGA or inter-chip bonding.

18 Claims, 20 Drawing Sheets

| Temp | tREF (ms) | T1 [70ns × 8192] | T2 [70ns × tREF / 8 /80ns] | REMAINDER [tREF/8 −T1−T2] |
|---|---|---|---|---|
| HIGH | 48 | 0.573ms | 5.25ms | 0.177ms |
| ROOM | 64 | 0.573ms | 7ms | 0.427ms |
| LOW | 128 | 0.573ms | 14ms | 1.427ms |

SEMICONDUCTOR DEVICE WITH NON-VOLATILE MEMORY AND RANDOM ACCESS MEMORY

BACKGROUND OF THE INVENTION

The present invention relates to multi-chip package memory semiconductor devices and more particularly to a semiconductor device including a DRAM and a non-volatile memory integrally.

A list of references cited in this specification is as follows and reference numbers will be used to represent the references. "Ref. 1" LRS1337 Stacked Chip 32M Flash Memory and 4M SRAM Data Sheet (retrieved on Apr. 21, 2000, Internet <URL:http://www.sharpsma.com/index.html>); "Ref. 2" EPO566306A2 (laid open on Oct. 20, 1993); "Ref. 3" JP-A-8-305680 (laid open on Nov. 22, 1996); "Ref. 4" JP-A-11-204721 (laid open on Jul. 30, 1999); and "Ref. 5" JP-A-10-11348 (laid open on Jan. 16, 1998).

Disclosed in "Ref. 1" is a multi-chip package semiconductor memory in which a flash memory (32M-bit capacity) and an SRAM (4M-bit capacity) that are in the form of a stacked chip are integrally molded in a FBGA type package. The flash memory and SRAM have each an address input terminal and a data input/output terminal that are shared by an input/output electrode of the FBGA type package. But their control terminals are independent of each other.

Illustrated in FIG. 17 of "Ref. 2" is a multi-chip package semiconductor memory having a flash memory chip and a DRAM chip that are integrally molded in a lead frame type package. Further, illustrated in FIG. 1 is a memory in which a flash memory and a DRAM have each an address input terminal, a data input/output terminal and a control terminal that are shared by an input/output electrode of the package to assure input/output operation.

Described in "Ref. 3" is a semiconductor device in which an SRAM chip is mounted on a die pad, a flash memory and a microprocessor chip that are connected to each other through bump electrodes are mounted on the SRAM chip, and these chips are integrally molded in a package of lead terminal type.

Illustrated in FIG. 15 of "Ref. 4" is a semiconductor device in which two smaller chips are mounted on the back of a single larger chip through an insulating plate and a resulting structure is integrally molded in a lead frame type package. There is a description that a chip combination of a flash memory chip, a DRAM chip and an ASIC (Application Specific IC) is mountable to permit an LSI mounted with a memory logic to be realized with a single package.

Described in "Ref. 5" is a technology in which two DRAM blocks are provided to store the same data in duplication and the timing of refresh is shifted between the two DRAM's to avoid a collision between external access and refresh of the DRAM. This control operation is carried out with a DRAM controller, which DRAM controller issues physically independent address signals and control signals to the two DRAM blocks.

Before making this invention, the present inventors have studied a cellular phone and a memory module for use therein having a flash memory and an SRAM that are mounted in a single package. The flash memory accommodates, in addition to an OS (operating system) of a cellular phone system, programs of communication and applications. On the other hand, the SRAM stores telephone numbers, an address book and terminating sounds and the like and besides, it maintains a work area temporarily used during execution of applications.

To hold data to be stored such as the telephone numbers and address book, a power source for holding data is connected to the SRAM even when a power source of the cellular phone remains to be turned off. For the purpose of holding the data for a long period, data hold current in the SRAM is desired to be small. However, the work area used by applications grows as the kinds of functions to be added to the cellular phone (such as distribution of music and games) increase and expectantly, there is a need for an SRAM of larger memory capacity. Further, up-to-date cellular phones become drastically highly functional and it has been found that with time, even an SRAM of increased capacity will have difficulties in coping with the highly graded function. More particularly, increasing the SRAM capacity encounters problems as below. In an SRAM of large capacity, the data hold current increases by an increment of storage capacity and in addition, an increased gate leakage current causes the data hold current to increase. This is because when the oxide insulating film of a MOS transistor is made to be thin by introducing a fine working process for the purpose of realizing a large-capacity SRAM, tunnel current flows from the gate to the substrate and as a result the data hold current increases.

SUMMARY OF THE INVENTION

An object of the present invention is to realize a memory having a large memory capacity and a small data hold current.

A typical means of the present invention will be exemplified as below. A semiconductor device comprises first and second DRAM chips and a chip including a memory controller for controlling access to the DRAM chips, these three chips being mounted in a single molded device. When receiving an external access signal during a first period, the memory controller delivers a first access signal to the first DRAM chip so as to access it and when receiving an external memory access signal during a second period, the memory controller delivers a second access signal to the second DRAM chip so as to access it.

Namely, by making the first and second DRAM chips hold essentially the same data in duplication so as to avoid a collision between external access and refresh, a large-capacity memory devoid of an access penalty due to refresh can be realized.

Other objects, features and advantages of the invention will become apparent from the following description of the embodiments of the invention taken in conjunction with the accompanying drawings.

DETAILED DESCRIPTION OF THE EMBODIMENTS

The present invention will now be described in greater detail by way of example with reference to the accompanying drawings. Circuit elements constituting each block in embodiments are not particularly limited but they are formed on a single semiconductor substrate of, for example, single crystal silicon through a known technology for integrated circuits such as CMOS (complementary MOS) transistors.

<Embodiment 1>

Figure 1:
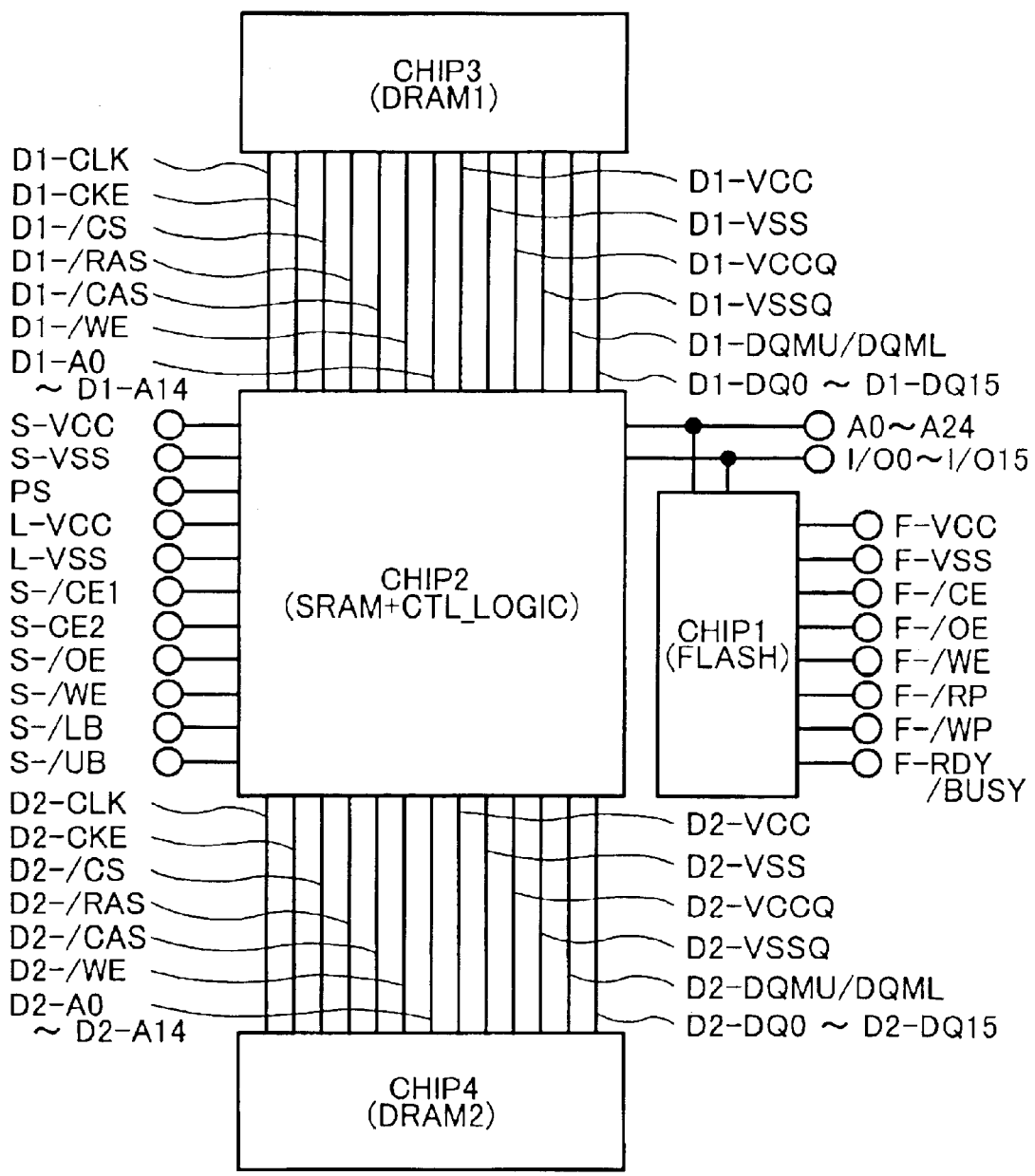
FIG. 1 is a diagram showing the construction of a memory module to which the present invention is applied.

FIG. 1 shows a first embodiment of a memory module representing an example of a semiconductor integrated circuit device to which the invention is applied. The present memory module is comprised of four chips. The individual chips will be described in the following.

Firstly, a CHIP1 (FLASH) is a non-volatile memory. As the non-volatile memory, a ROM (read only memory), an EEPROM (electrically erasable and programmable ROM) or a flash memory, for instance, may be used. The present embodiment will be described by taking a flash memory, for instance. A static random access memory (SRAM) and a control circuit (CTL_LOGIC) are integrated in a CHIP2 (SRAM+CTL_LOGIC). The control circuit controls the SRAM integrated in the CHIP2, a CHIP3 and a CHIP4. The CHIP3 (DRAM1) and CHIP4 (DRAM2) are dynamic random access memories (DRAM's). The DRAM's differ in internal structure and interface so that they may be sorted into a variety of kinds such as EDO, SDRAM and DDR. Any kinds of DRAM's may be used for the present memory module but the present embodiment will be described by way of example of a typical dynamic random access memory or SDRAM for performing read/write by a command synchronous with a clock.

Externally inputted to this memory module are addresses (A0~A24) and command signals (S-/CE1, S-CE2, S-/OE, S-/WE, S-/LB, S-/UB, F-/WE, F-/RP, F-/WP, F-RDY/BUSY, F-/CE, and F-/OE). Power sources are supplied through S-VCC, S-VSS, F-VCC, F-VSS, L-VCC and L-VSS and for input/output of data, I/O0~I/O15 are used. Address signal lines and data input/output lines are connected in common to the CHIP1 (FLASH) and CHIP2 (SRAM+CTL_LOGIC). Clocks (D1-CLK and D2-CLK), addresses (D1-A0~D1-A14 and D2-A0~D2-A14), commands (D1-CKE, D2-CKE, D1-/CS, D2-/CS, D1-/RAS, D2-/RAS, D1-/CAS, D2-/CAS, D1-/WE, D2-/WE, D1-DQMU/DQML and D2-DQMU/DQML), data for DRAM (D1-DQ0~D1-DQ15 and D2-DQ0~D2-DQ15) and power sources (D1-VCC, D2-VCC, D1-VSS, V2-VSS, D1-VCCQ, D2-VCCQ, D1-VSSQ and D2-VSSQ), which are necessary for operation of the CHIP2, CHIP3 and CHIP4, are supplied. One feature of the memory module is that signal terminals for DRAM interface are not directly seen at input/output nodes between this memory module and the outside.

The individual command signals will be described briefly. Inputted to the CHIP2 are the S-/CE1 and S-CE2 which are chip enable signals, the S-/OE which is an output enable signal, the S-/WE which is a write enable signal, the S-/LB which is a lower byte selection signal and the S-/UB which is an upper byte selection signal. Inputted to the CHIP1 are the F-/WE which is a write enable signal, the F-/RP which is a reset/deep power down signal, the F-/WP which is a write protect signal, the F-RDY/BUSY which is a ready/busy output signal, the F-/CE which is a chip enable signal and the F-/OE which is an output enable signal, these signals being used for controlling the flash memory.

In the present memory module, the common address lines (A0~A24) and the common data input/output lines (I/O0~I/O15) are used for accessing the flash memory, SRAM and DRAM. In accessing the flash memory (CHIP1), not only the address lines (A0~A24) but also necessary ones of the command signals F-/WE, F-/RP, F-/WP, F-RDY/BUSY, F-/CE and F-/OE are rendered to be active. When accessing the SRAM(CHIP2) or the DRAM's (CHIP3 and CHIP4), not only the address lines (A0~A24) but also necessary ones of the command signals S-/CE1, S-CE2, S-/OE, S-/WE, S-/LB and S-UB are rendered to be active. Any access is carried out through a so-called SRAM interface method.

Access to the SRAM is discriminated from that to the DRAM in accordance with a value of an inputted address and the control circuit (CTL_LOGIC) determines an access destination in accordance with the inputted address value. The range of addresses for accessing the SRAM and the range of addresses for accessing the DRAM are determined by setting in advance values in a register provided in the control circuit (CTL_LOGIC).

In accessing the DRAM, the control circuit (CTL_LOGIC) generates an address signal and command signals necessary for access to the DRAM and then access to the DRAM is carried out. In case of read access, read data from the DRAM is once read to the control circuit(CL_LOGIC) through the data I/O for DRAM (D1-DQ0~D1-DQ15 or D2-DQ0~D2-DQ15) and thereafter delivered to the data input/output lines (I/O0~I/O15) of the memory module. In case of write access, write data is inputted from the data input/output lines (I/O0~I/O15) of the memory module and thereafter inputted to the DRAM1 and DRAM2 via the data I/O for DRAM (D1-DQ0~D1-DQ15 and D2-DQ0~D2-DQ15 ).

Power sources to the DRAM1 and DRAM2 are supplied from the L-Vcc and L-VSS and connected to the D1-VCC, D2-VCC, D1-VSS, D2-VSS, D1-VCCQ, D2-VCCQ, D1-VSSQ and D2-VSSQ via the control circuit (CTL_LOGIC). Power source supply to the DRAM is controlled by the command signal PS and can be interrupted as necessary. In turning on the interrupted power source to the DRAM again, the DRAM must be initialized. The control circuit (CTL_LOGIC) performs signal generation and timing control which are necessary for the initialization of the DRAM.

Refreshing the DRAM can be achieved by causing the control circuit (CTL_LOGIC) to periodically turn on a bank active command. Generally, refresh characteristics of the DRAM are degraded at high temperatures but when a thermometer is provided in the control circuit (CTL_LOGIC) with a view to narrowing the turn-on interval of bank active command at high temperatures, the DRAM is allowed to be used in a wider temperature range.

Further, by adjusting the timing of refresh after the control circuit (CTL_LOGIC) has held one data at addresses of two different locations on the DRAM, refresh can be shielded from the outside of the memory module such that access is not limited by a refresh operation.

According to the embodiment described as above, a large-capacity memory module using an inexpensive general-use DRAM can be realized by taking over the SRAM interface method. In the memory module according to the invention, the DRAM is used but the refresh necessary for the DRAM is executed inside the module to permit the DRAM to be used without considering refresh as in the case of the SRAM. Also, by changing the interval of refresh executed inside the module in accordance with temperatures, the use temperature range of the DRAM can be broadened to thereby realize a large-capacity memory module of wide use temperature range.

Further, since the refresh of the DRAM can be shielded from the outside of the memory module by duplicating the hold data in the DRAM and adjusting the timing for refresh, there is no need of adjusting the timing by considering refresh when the present memory module is accessed. Accordingly, the present memory module can be used similarly to the conventional memory module using only the SRAM and therefore, the large-capacity memory module can be used without changing the conventional system.

Another object of the invention is to realize a memory module having less data hold current. To this end, the interval of refresh to be executed inside the module is prolonged especially at low temperatures so that the data hold current may be reduced. For further reduction of the data hold current, the power source supplied to the DERAM may be interrupted and only data stored in the SRAM may be held. By storing only the data to be held in the SRAM and by stopping the supply of power source to the memory storing data unnecessary to be held, only necessary data can be held with a minimized data hold current.

Figure 2:
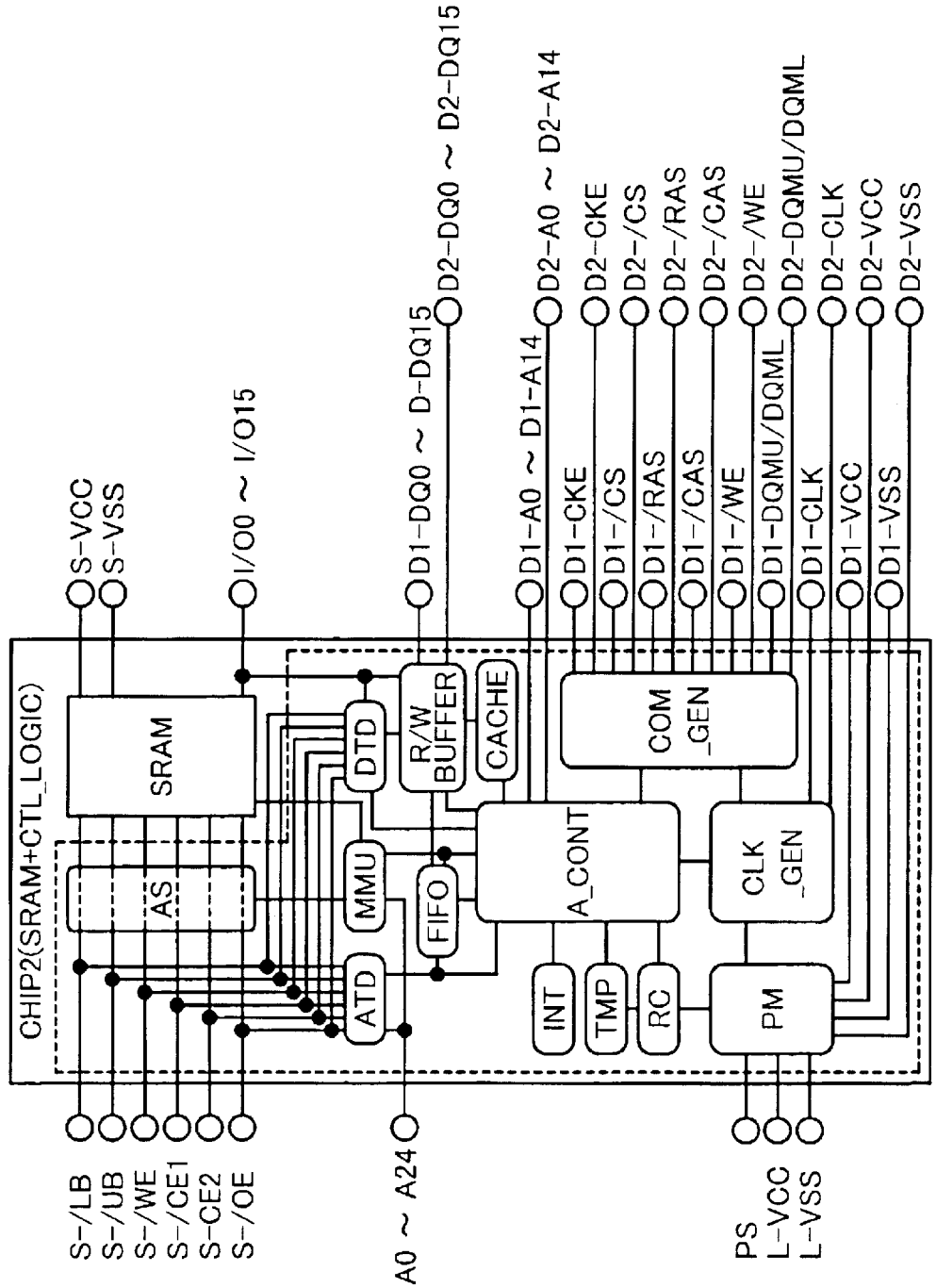
FIG. 2 is a block diagram showing an example of CHIP2 in FIG. 1.

FIG. 2 shows the CHIP2 (SRAM+CTL_LOGIC) in greater detail. The CHIP2 (SRAM+CTL_LOGIC) is comprised of the SRAM and the control circuit (CTL_LOGIC) and the integrated SRAM is an asynchronous SRAM generally used in the past. The control circuit (CTL_LOGIC) is a portion of CHIP2 excepting the SRAM, the portion being indicated as an area enclosed with dotted line in FIG. 2, and it includes AS, MMU, ATD, DTD, FIFO, R/W BUFFER, CACHE, A_CONT, INT, TMP, RC, PM, CLK_GEN and COM_GEN. Operation of individual circuit blocks will be described hereunder.

The memory management unit MMU converts an address inputted externally in accordance with a value set in a built-in register and selects a memory to be accessed. When the SRAM is selected, the access switch (AS) transmits an address signal and command signals to the SRAM so that the SRAM may be accessed.

The address transition detector circuit (ATD) detects changes in the address signal and command signals to deliver pulses. Also, the data transition detector circuit (DTD) detects changes in a data signal and the command signal to deliver pulses. Through detection of the changes in the signals by these detection circuits, access to the memory is started.

For the purpose of reading/writing the DRAM, the R/W BUFFER temporarily holds data. The fast-in fast-out memory (FIFO) is a fast-in fast-out buffer circuit adapted to temporarily hold write data to the DRAM and its address. When switching of the DRAM subject to refresh and one access operation are carried out for a long period of time, the CACHE temporarily stores write data to the DRAM and read data therefrom.

The initialization circuit INT initializes the DRAM when power source supply to the DRAM is started. The temperature measurement module (TMP) measures temperatures and delivers a signal complying with a measured temperature to the RC and A_CONT. The RC designates a refresh counter adapted to generate an address for refresh in accordance with an interval of refresh of the DRAM. Then, the refresh interval can be so changed as to comply with a temperature by an output signal of the temperature measurement module (TMP).

The power module (PM) performs the power source supply to the control circuit (CTL_LOGIC) of CHIP2 and to the DRAM and the control of the power source. The clock generator (CLK_GEN) generates clocks to supply them to the DRAM and control circuit (CTL_LOGIC). The command generator (COM_GEN) generates commands necessary for access to the DRAM. The access controller (A_CONT) controls operation of the whole of CHIP2 (SRAM+CTL_LOGIC) and generates an address for getting access to the DRAM. The present memory module operates as will be described below.

To get access to the memory of CHIP2 (SRAM+CTL_LOGIC), interface is set up through the asynchronous SRAM method generally used in the past. When the address signals (A~A24) or the command signals (S-/LB, S-/UB, S-/WE, S-/CDL, S-CE2 and S-/OE) change, the ATD detects the changes and access to the memory is then started. Values of the address signals (A~A24) inputted externally are first converted by means of the MMU. A pattern of conversion is determined by a value inputted in advance to the register inside the MMU. It is determined by the converted address that the access destination is either the SRAM or the DRAM.

When access to the SRAM is carried out, the MMU transmits the converted address to the SRAM and at the same time, instructs the access switch (AS) to transfer commands. The access switch (AS) transfers the commands to the SRAM and access to the SRAM is started. In operation after that, access to the so-called asynchronous SRAM is carried out.

When read access to the DRAM is carried out, an address inputted externally and converted by the MMU and commands detected by the ATD are sent to the A_CONT. The A_CONT determines from the sent address and commands that access to the DRAM is to be executed and instructs the COM_GEN to issue commands to the DRAM. Also, the A_CONT converts the address received from the MMU into a row address and a column address of the DRAM and deliver them to one of the two DRAM's which is in charge of access. In synchronism with the clock generated by the CLK_GEN, the COM_GEN issues commands to the DRAM in charge of access, as in the case of the address. The DRAM receiving the commands and address delivers data which in turn is transferred to the I/O0~I/O15 through the R/W BUFFER, thus ending the read access.

When write access to the DRAM is carried out, an address inputted externally and converted by the MMU, commands detected by the ATD, commands detected by the DTD and data are sent to the A_CONT. The A_CONT determines from the sent address and commands that access to the DRAM is to be executed and instructs the COM_GEN to issue commands to the DRAM. Also, the A_CONT converts the address received from the MMU to an address for DRAM and delivers it to one of the two DRAM's which is in charge of access. In synchronism with the clock generated by the CLK_GEN, the COM_GEN issues commands to the DRAM in charge of access, as in the case of address. After being inputted from the I/O0~I/O15 and once held in the R/W BUFFER, the data to be written is sent to the DRAM in charge of access and a write operation is carried out. The data to be written and its address are once held in the FIFO so as to be written in the other DRAM after completion of refresh.

When the memory module is used at high temperatures, the interval of refresh of the DRAM is shortened to perform refresh frequently. Thus, in the present memory module, the temperature measurement module (MP) measures temperatures to notify them to the refresh counter and the access controller. As the temperature rises, the refresh counter changes the refresh interval to make it shorter and delivers an address for refresh. Conversely, as the temperature lowers, the refresh interval of the DRAM is so changed as to extend, thus ensuring that the data hold current can be decreased. In such a case as above, too, the temperature measurement module (TMP) measures temperatures and notifies them to the refresh counter and access controller. As the temperature lowers, the refresh counter changes the refresh interval to make it longer and then delivers an address for refresh.

An apparatus mounted with the memory module is sometimes desired to decrease in current consumption in accordance with an operating state. Therefore, methods will be described which change the operating state of the memory by means of a power module to reduce power consumption.

Firstly, in the simplest method, the power module conforms to the command signal PS to stop refresh carried out by the refresh counter. Through this, data stored in the DRAM is destroyed but power necessary for refresh can be reduced.

If further reduction of power consumption is desired, the power source supplied to the DRAM inside the memory module is interrupted. In this case, the power module complies with the command signal PS delivered out of the apparatus to stop power supply to the D1-VCC and D2-VCC applied to the DRAM. The interruption of power source may be applied to the two DRAM's or the interruption of power source supply may be limited to that applied to one of the DRAM's.

In case furthermore reduction of power consumption is desired, the power module may respond to the command signal PS to also stop the power source supply to a portion of the CHIP2 (SRAM+CTL_LOGIC) which participates in access to the memory of DRAM. In this state, power source may be connected to, for example, only the MMU and AS in addition to the SRAM in the CHIP2 (SRAM+CTL_LOGIC) to render them operated, so that a mode can be set up in which access to only the SRAM can be executed.

Further, it is possible for the command PS to set up an operating state in which data of only the SRAM can be held. In this case, power sources excepting ones (S-VCC, S-VSS) connected to the SRAM are interrupted to inhibit access to the memory. In this state, the memory module holds data stored in the SRAM.

In order to resume operation of the DRAM after the power source supply to the DRAM is once stopped to disable the DRAM to operate, there is a need for initialization of the DRAM in addition to the resumption of the power source supply. The initialization may be achieved through a general method but in the present memory module, the initial circuit (INT) indicates the procedure for initialization to the access controller (A_CONT) to make it execute the initialization.

When refresh of the DRAM is stopped, initialization of the DRAM is also needed to enable the DRAM to operate again and in this case as well, the initial circuit (INT) indicates the procedure for initialization to the access controller (A_CONT) to make it execute the initialization.

FIGS. 3, 4, 5 and 6 show examples of a memory map converted by the MMU. Any of the exemplified memory maps can be selected in accordance with a value set in the register inside the MMU. In the present embodiment, though being not particularly limitative, a memory module will be exemplified, in which the memory area of non-volatile memory is of 32Mb, the data hold area by SRAM is of 2Mb and the memory area of DRAM is of 256Mb, to explain a typical memory map.

Figure 3:
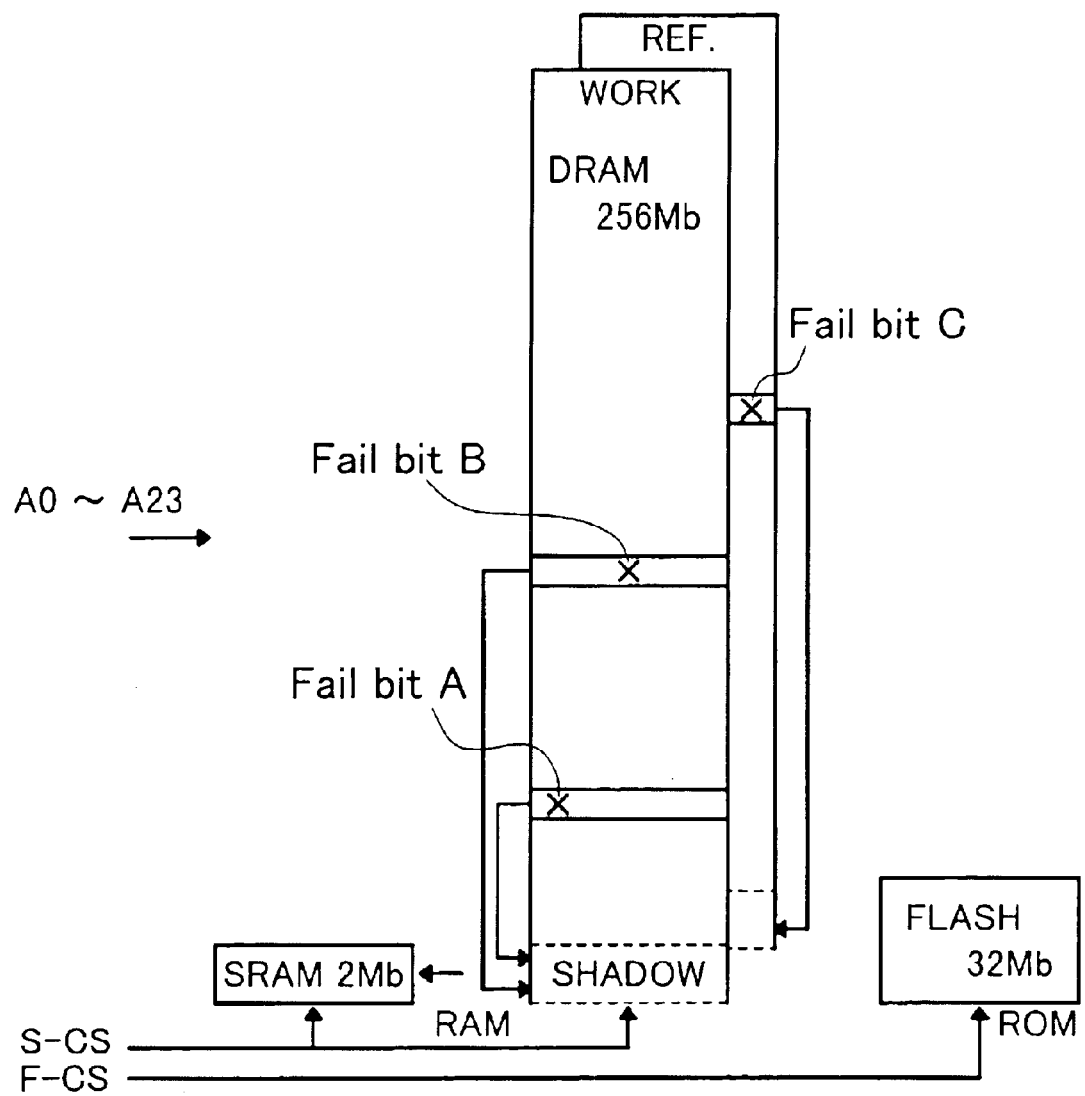
FIG. 3 is a diagram for explaining an example of an address map in the memory module to which the invention is applied.

In FIG. 3, addresses A0~A23 inputted externally are shared by the flash memories CHIP1 and CHIP2. For selection of an access destination, signals S-CS and F-CS for chip selection are used. When the F-CS is rendered to be active, the FLASH is selected so that it may be accessed and when the S-CS is activated, the CHIP2 is selected so that it may be accessed. The F-CS is a general term of the command signals F-/WE, F-/RP, F-/WP, F-RDY/BUSY, F-/CE and F-/OE used for accessing the CHIP1 and the S-CS is a general term of the command signals S-/CE1, S-CE2, S-/OE, S-/WE, S-/LB and S-/UB used for accessing the CHIP2.

The two DRAM's (CHIP3 and CHIP4) are mapped to the same address space to hold the same data. Each DRAM repeats alternately a period for taking charge of access (WORK period) and a period for preferentially executing refresh (REF. period). Memory-access from external is applied to the DRAM in the WORK period, that is, undertaking the WORK period.

In the present example, the 2Mb SRAM area is set concentrically in a lower part of the address space. This area is mapped to the memory space together with duplication of the DRAM but access to the DRAM is not carried out to permit access to only the SRAM to be executed.

When only data of the SRAM is held and used by controlling the power source of the memory module, the area of the SRAM can be managed concentrically.

The inaccessible area of DRAM (SHADOW) can be used to relieve memory cells of the DRAM. The present memory module is so contrived as to prolong the refresh interval at low temperatures for the purpose of reducing power consumption but in this case, a memory cell having difficulties in holding data (Fail bit) may also develops. In such an event, the DRAM undertaking the SHADOW can be used to substitute for the Fail bit. In FIG. 3, the DRAM undertaking the WORK period has Fail bit A and Fail bit B and the DRAM undertaking the REF. period has Fail bit C. Addresses of these Fail bits are registered in advance and when access to a Fail bit is carried out, a corresponding SHADOW is accessed in place of the Fail bit. The Fail bit can be relieved by the substitutive SHADOW and the refresh interval is prolonged at low temperatures, thus making it possible to realize a memory module of less power consumption.

Figure 4:
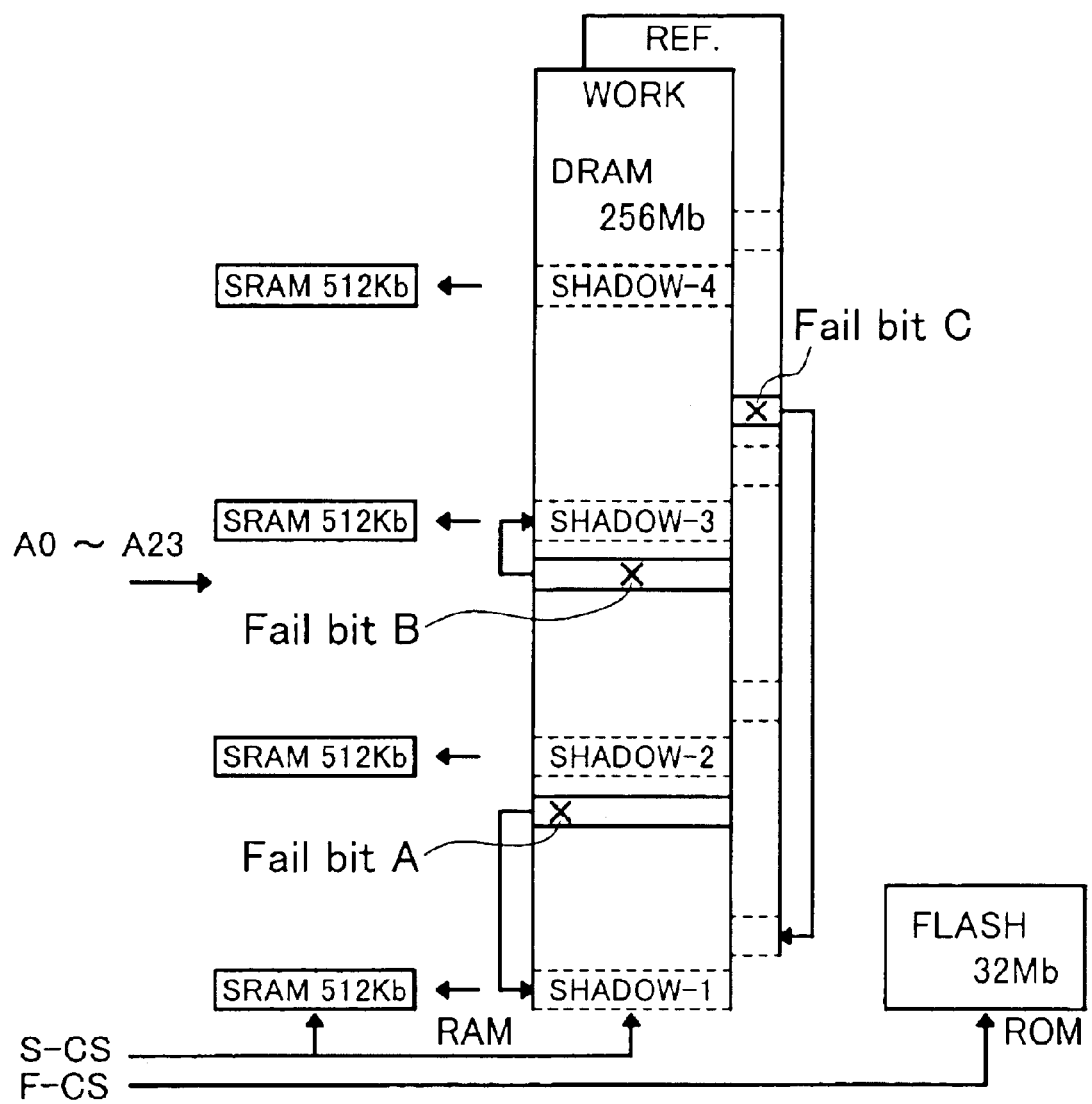
FIG. 4 is a diagram for explaining another example of an address map in the memory module to which the invention is applied.

In an exemplified memory map shown in FIG. 4, the SRAM area is distributed to a plurality of address spaces. The address space of SRAM also overlaps the address space of DRAM and for accessing the overlapping address space, the SRAM is accessed. A plurality of SHADOW's are used for relieving a plurality of Fail bits. Contrivance is made in this example such that the SRAM area is set in a unit of 512 Kb, which is coincident with a unit of write erase of the FLASH memory, in order that the coincidence of the management unit of the address space to that of the FLASH memory can simplify handling of the memory space by the OS or by the program.

In case the power source of the memory module is controlled to hold and use only data of the SRAM, the area of the SRAM can be arranged such that it is distributed in the memory space.

Figure 5:
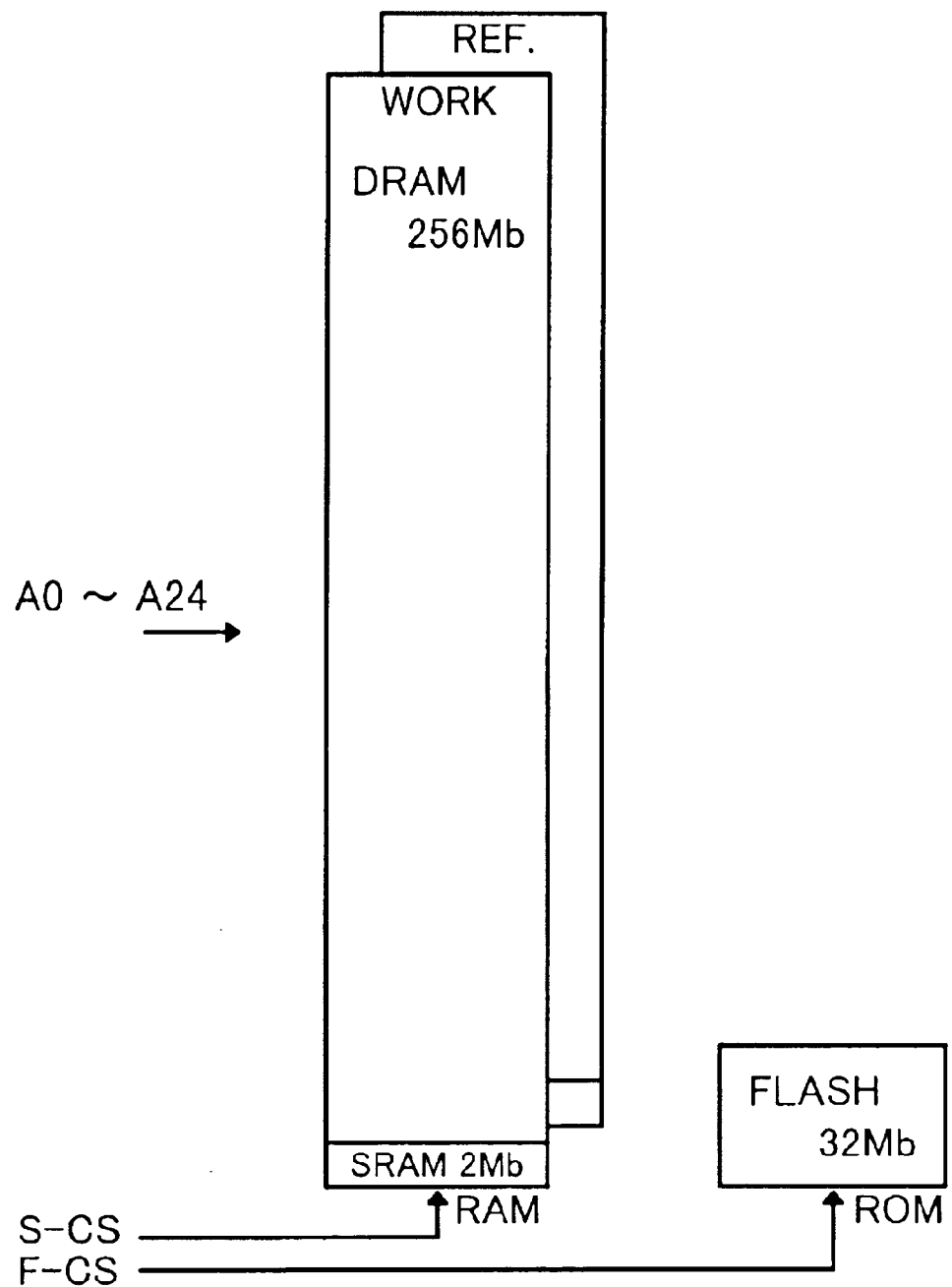
FIG. 5 is a diagram for explaining still another example of an address map in the memory module to which the invention is applied.

In an exemplified memory map shown in FIG. 5, the SRAM and DRAM are mapped to different address spaces, excluding any SHADOW caused by overlapping or duplication. Accordingly, the address space amounts to 258Mb that is the sum of 256Mb of DRAM and 2Mb of SRAM, so that a wider address space can be obtained. Correspondingly, an address line A24 is added.

Figure 6:
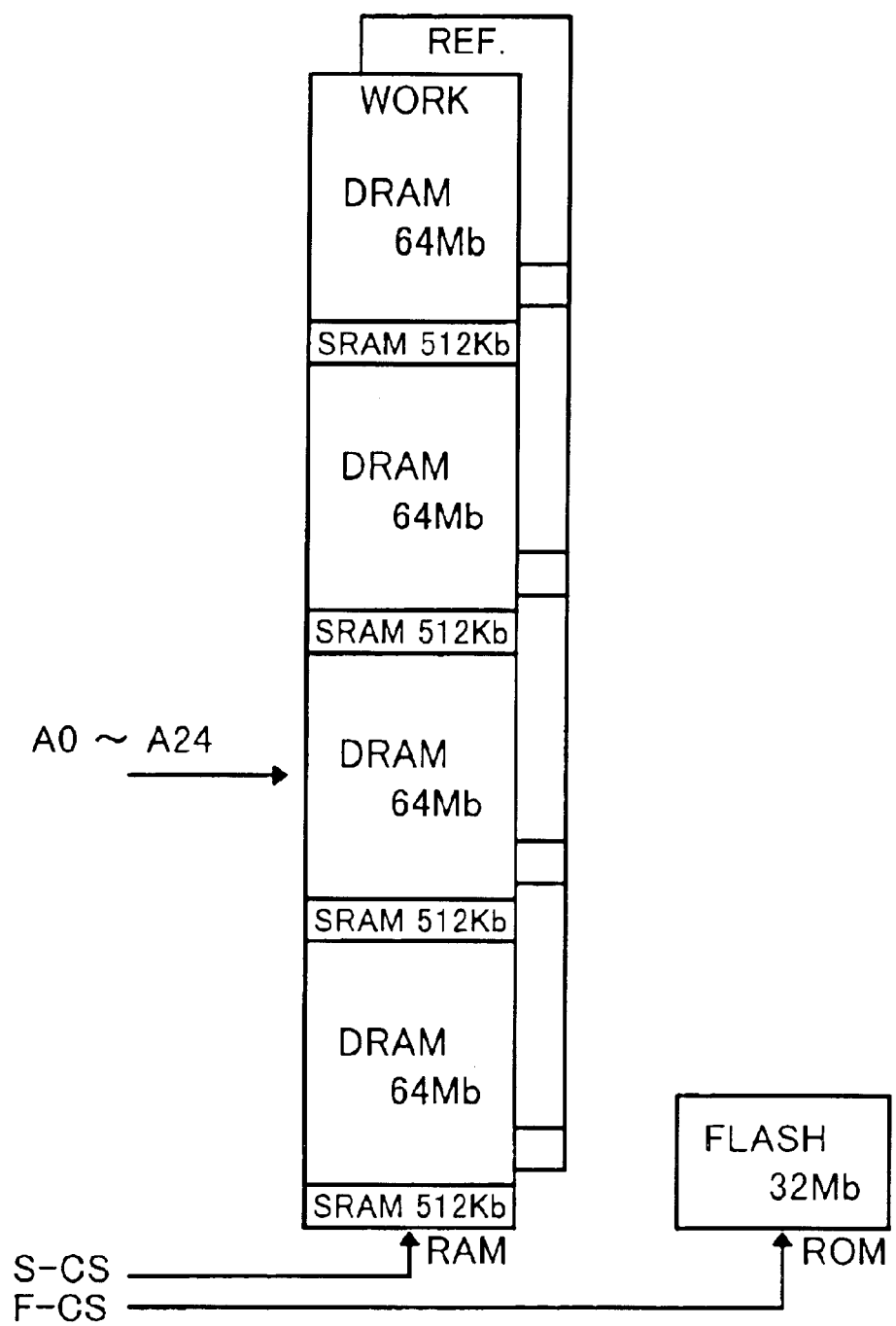
FIG. 6 is a diagram for explaining still another example of an address map in the memory module to which the invention is applied.

In an exemplified memory map shown in FIG. 6, the SRAM area of FIG. 5 is arranged such that it is divided into four. Like the example shown in FIG. 5, a broader address space can be obtained. Further, when the power source of the memory module is controlled to hold and use only the data of the SRAM, like the example shown in FIG. 4, the area of SRAM can be arranged such that it is distributed in the memory space.

In this manner, the MMU can assign the SRAM area and DRAM area to the designated address areas. The method for the assignment can be changed easily by changing the value of the register set in the MMU.

Especially when reduction of the data hold current is desired, the address space storing data desired to be held may be assigned to the SRAM area and the power source supply to the DRAM may be stopped. According to this method, a memory module of less data hold current can be realized.

Figure 7:
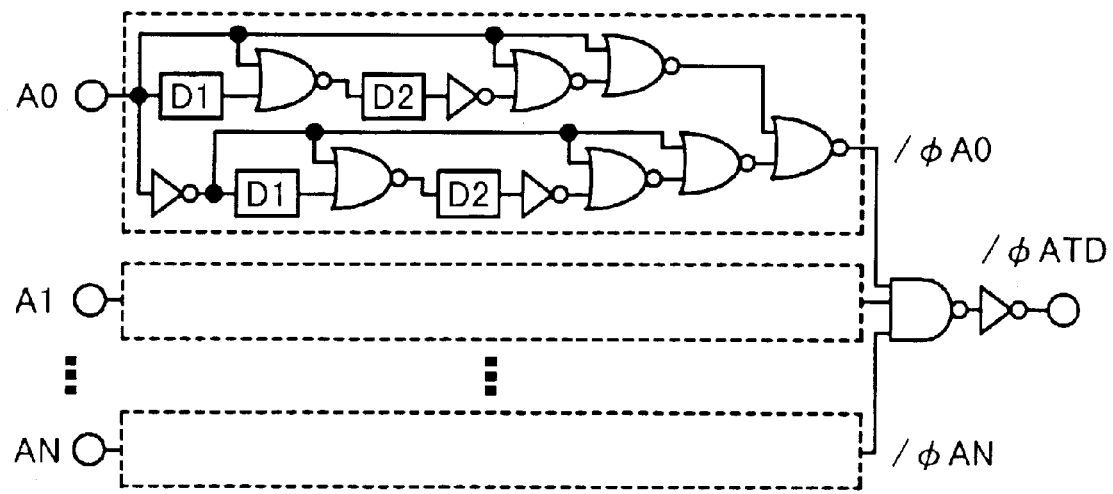
FIG. 7 is a diagram showing an example of the construction of an ATD circuit or DTD circuit in FIG. 2.
Figure 7:
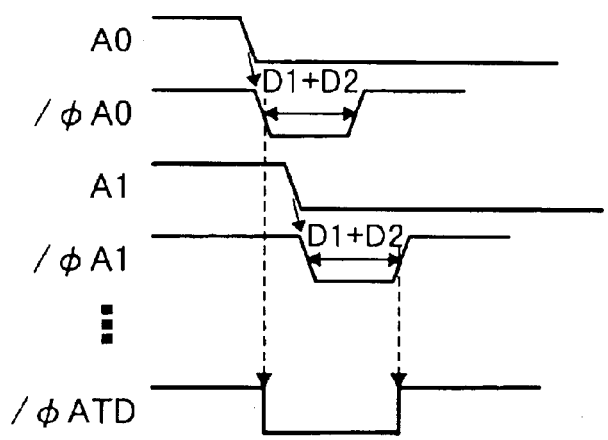

FIG. 7 shows an example of the construction of the ATD circuit and operation waveforms therein. The address transition detection circuit (ATD) detects changes in values on the address signal lines to generate pulses. Symbols D1 and D2 used in the drawing of the circuit indicate delay elements for generating delays, respectively. When changes occur on the address lines (A0~AN), the ATD delivers pulses (/φA0~/φAN) each having a width equal to the sum of delays due to the delay elements D1 and D2. Further, in consideration of irregularities in operation of the individual address lines, a signal /φATD equal to the sum of these pulses is generated so as to detect changes in address values appearing on the address lines. As shown in FIG. 2, the ATD is connected with not only the address lines but also the command signals and so it detects an input of new command in addition to a change in address. The construction of the data transition detection circuit (DTD) is the same as that of the ATD. The DTD detects a change in data line and changes in command signals for write operation to recognize data for write and the write commands.

In this manner, each of the ATD and DTD detects the synchronously changing SRAM interface signals to start operation of the memory module. With these circuits, the memory module operational by the asynchronous SRAM interface can be realized. By detecting the asynchronously changing signals after forming them into pulses and handling the pulses as synchronous signals, a memory device operating synchronously in the memory module can also be used.

Figure 8A:
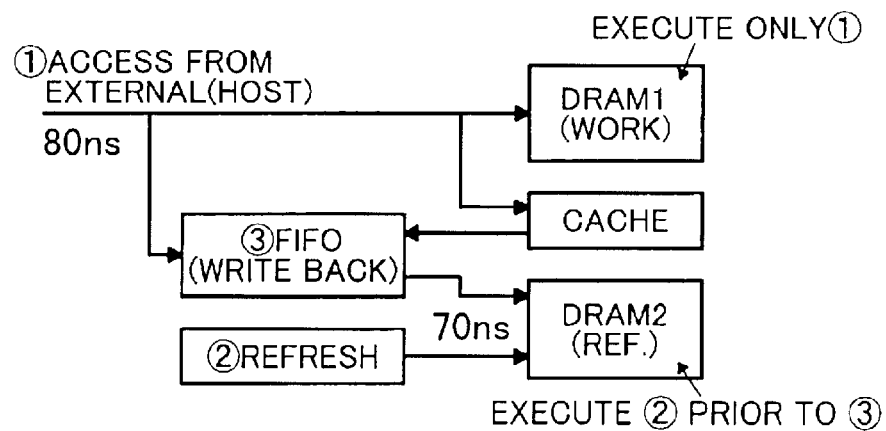
FIGS. 8A to 8C are diagrams for explaining the behavior of access to and refresh of a DRAM to be carried out compatibly.
Figure 8B:
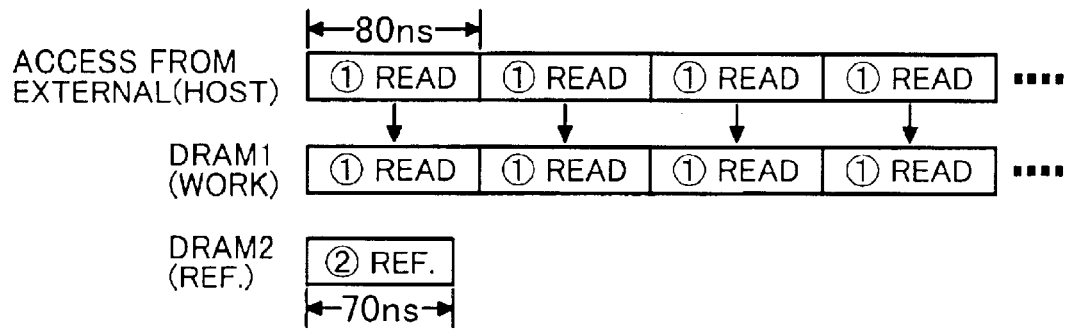
Figure 8C:
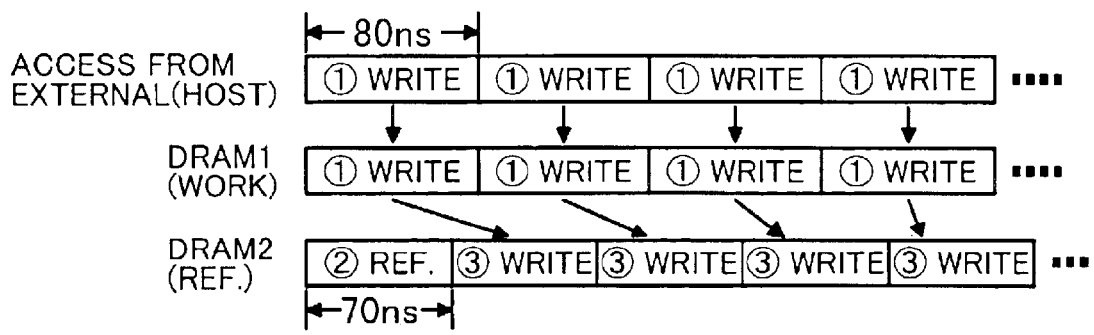

FIGS. 8A to 8C show the principle of an access control method for shielding refresh of the DRAM. Operation of the DRAM in the present invention can be explained from such a view that access to the bank undertaking the REF. period is assigned with the preference order and then executed.

FIG. 8A diagrammatically depicts the preference order assigned to access. This figure indicates that the DRAM1 undertakes the WORK period and the DRAM2 undertakes the REF. period. Also illustrated are a CACHE adapted to temporarily substitute for access, a FIFO adapted to temporarily have custody of write data and a refresh request generated from the RC.

In the DRAM1 in the WORK period, only access from external ① is executed. On the other hand, in the DRAM2 undertaking the REF. period, refresh ② is executed most preferentially. Next, write ③ of data held in the FIFO is executed. The access control circuit (A_CONT) decides the preference order of these operations and executes them.

One access operation of the external access ① is executed within 80 ns but the refresh ② and write back ③ from the FIFO are executed within 70 ns. In the present memory module, this time difference is utilized to shield refresh from the outside.

FIG. 8B shows behavior of execution of read access, particularly indicating that read access is executed continuously while the DRAM1 undertakes the WORK period. IN the DRAM1, only the external access ① is executed within 80 ns and data is read to complete access. On the other hand, in the DRAM2, only the refresh ②is executed within 70 ns.

A case of execution of write access is shown in FIG. 8C. Write access from external ① is first executed in the DRAM1 undertaking the WORK period. Concurrently, the FIFO holds the write data. In the DRAM2 in the REF. period, the refresh ② is first executed most preferentially. Subsequently, write ③ of data held in the FIFO is executed.

It will be noted that the DRAM1 during the WORK period needs 80 ns for one operation whereas the DRAM2 in the REF. period completes one operation within 70 ns. Accordingly, even when the DRAM2 executes a refresh operation, it executes a write operation faster than the DRAM1 and eventually catches up with the DRAM1 after completing writing of all data in the FIFO.

Figure 9:
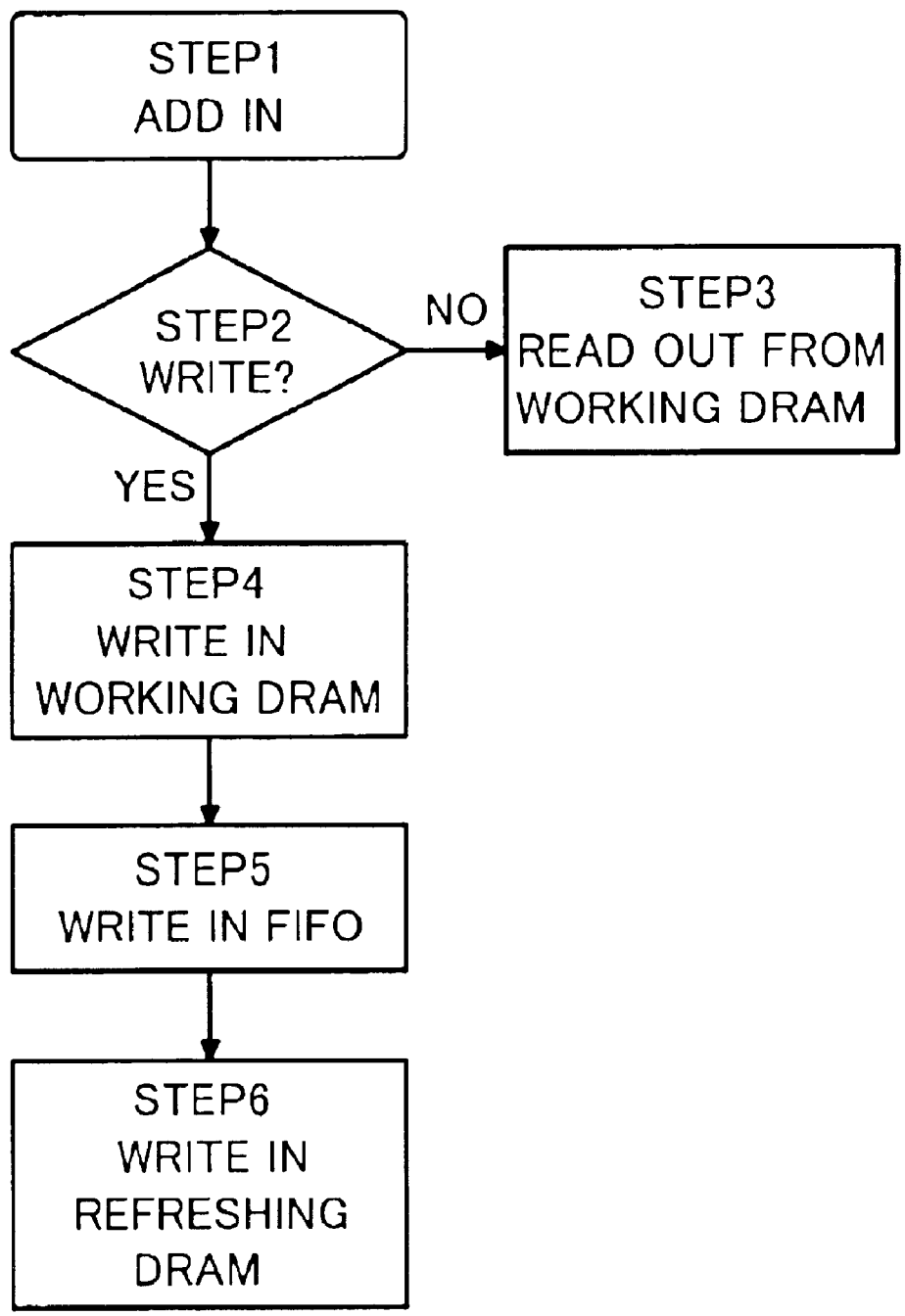
FIG. 9 is a flowchart showing the flow of a process when access to the DRAM is carried out.

FIG. 9 is a flowchart useful to explain the overall operation when access to the DRAM occurs. In STEP1, an address is inputted and an operation starts. In STEP2, the kind of access is decided from commands. The ensuing operation differs depending on the kind of access. In the case of access for read, the program proceeds to STEP3. In the STEP3, data is read out of the DRAM undertaking the WORK period and operation ends. In the case of access for write, the program proceeds to STEP4. In the STEP4, write in the DRAM undertaking the WORK period is executed. Meanwhile, in STEP5, written data and the address are held in the FIFO. Then, when refresh ends in the SDRAM during the REF. period, the program proceeds to STEP6, in which the data held in the FIFO is written in the DRAM undertaking the REF. period.

Figure 10:
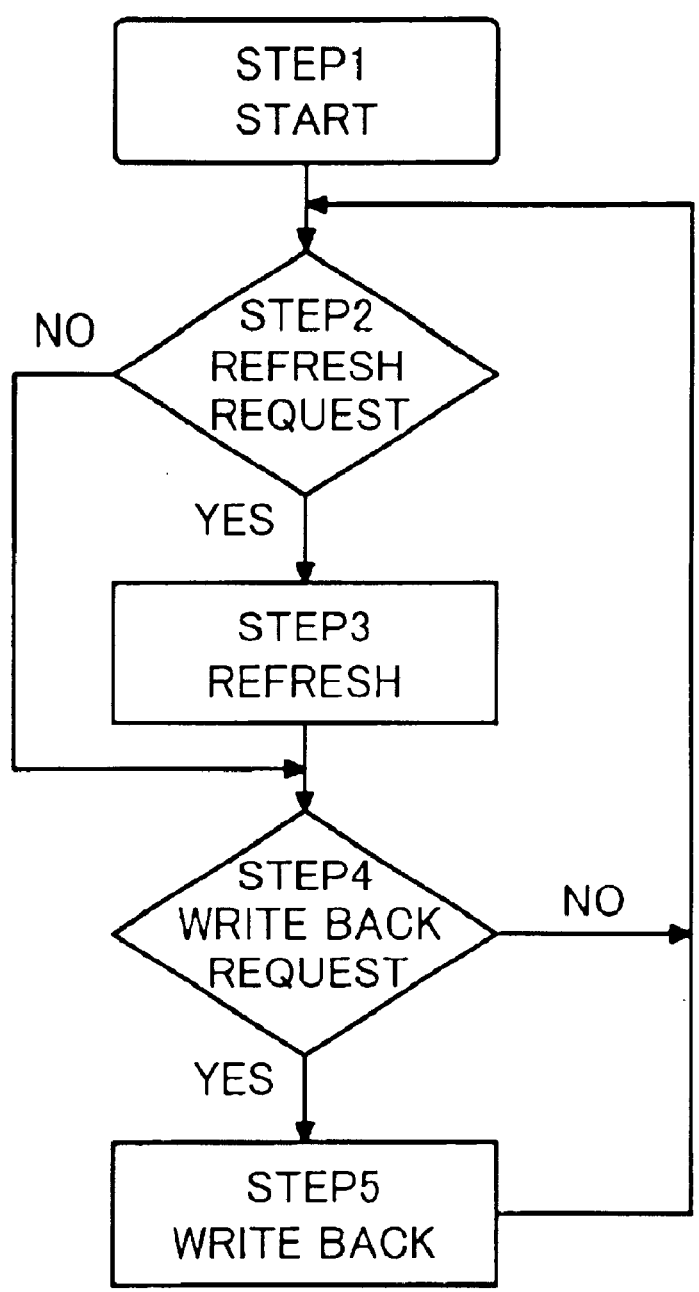
FIG. 10 is a flowchart showing the flow of operation in the DRAM undertaking REF. period.

FIG. 10 is a flowchart for explaining operation of the DRAM undertaking the REF. period. STEP2 and STEP3 concern execution of refresh and STEP4 and STEP5 concern execution of write back. The REF. period is started in the STEP1 and in the next STEP2, it is first decided whether a request for refresh is present. In the presence of the refresh request, the program proceeds to the STEP3, in which the refresh is executed. The number of refresh operations is managed and refresh of a determined area is executed. When the refresh request is absent and refresh ends, the program proceeds to the STEP4, in which it is decided whether data accumulated in the FIFO is present. In the presence of the data, the program proceeds to the STEP5, in which write back to the DRAM is executed. When write of the data held in the FIFO is completed in the STEP5 and when the absence of data in the FIFO is determined in the STEP4, the program returns to the STEP2.

Figures 11A, 11B:
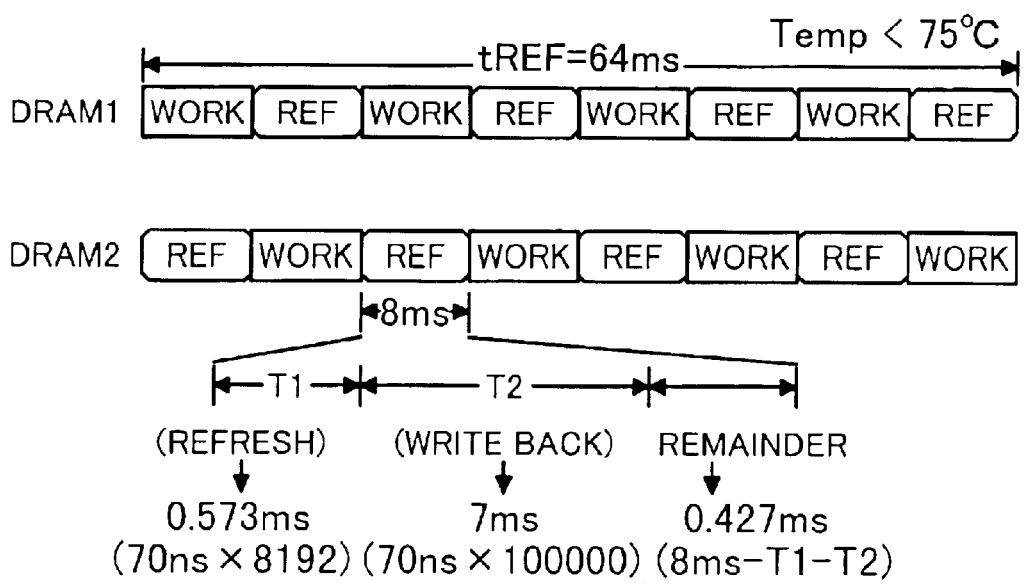
FIGS. 11A and 11B are diagrams for explaining an example of a method of refreshing the DRAM.

FIGS. 11A and 11B show behavior of operation in which the two DRAM's are operated on time-sharing base to shield refresh of the DRAM. FIG. 11A shows an example of operation of the DRAM at 75° C. or below corresponding to the normal use temperature range. The two DRAM's (DRAM1 and DRAM2) repeat alternately the WORK period and REF. period. The DRAM undertaking the WORK period, indicated by WORK, operates in response to external access. The DRAM1 first undertakes the WORK period to deal with access from external. Meanwhile, the DRAM2 undertaking the REF. period carries out a refresh operation preferentially and in the case of external access being write, it writes data after completion of the refresh operation.

Memory cells of the DRAM need to be refreshed typically within 64 ms. In the illustrated example, the WORK period and the REF. period are switched 8 times within this period of time, so that the DRAM1 and DRAM2 4 times repeat the WORK period and REF. period alternately.

As will be described below on the assumption that time required for a refresh operation executed within 8 ms corresponding to one REF. period is designated by T1 and time required for a write-back operation of data saved in the FIFO as a result of write access executed within the same time is designated by T2, refresh and write back can be carried out within the REF. period.

When taking an SDRAM of 256Mbits, for instance, its memory structure is of 8192 rows×512 columns×16 bits×4 banks and execution of 32768 (8192 rows×4 banks) refresh operations need to be executed within 64 ms. Accordingly, in the example of FIG. 11A in which one DRAM undertakes 4 REF. periods within 64 ms, 8192 refresh operations are carried out during one REF. period (8 ms).

Since time required for one refresh operation is 70 ns, there results T1=70 ns×8191 (operations)=0.573 ms. On the other hand, a maximum value of write access operations executed externally within 8 ms amounts to 100000 (operations)=(8 ms/80 ns) on the assumption that all access operations are for write. Then, time T1 required for writeback of the write operations to the DRAM during the REF. period is 7 ms (70 ns×100000(operations)). Accordingly, there results T1+T2=7.573 ms less than 8 ms, demonstrating that refresh and write back can be executed sufficiently within the REF. period.

In addition, refresh operations can be executed simultaneously in a plurality of banks inside the DRAM undertaking the REF. period. In that case, the number of refreshing operations executed within the T1 period can be reduced and hence, the T1 period can be shortened. With the T1 period reduced, not only the memory capacity of the FIFO can be reduced but also a high-speed memory can be realized by further shortening the interval of external access.

FIG. 11B shows a case where the refresh interval of the DRAM is changed. Generally, refresh characteristics of the DRAM are deteriorated at high temperatures. This accounts for the fact that by shortening the refresh interval at high temperatures, for example, 75° C. or more, holding of data is ensured to permit the DRAM to be operated in a broader temperature range. In this example, the refresh interval is shortened to 48 ms at a high temperature. The T1 remains unchanged but T2 is 5.25 ms with the remainder amounting to 0.177 ms, indicating that refresh and write back can be executed during the REF. period.

On the other hand, at low temperatures, the data hold current can be reduced by extending the refresh period. In the illustrated example, the refresh interval is twice prolonged to 128 ns. In this case, the REF. period amounts up to 16 ms. The T1 remains unchanged but the T2 is 14 ms with the remainder amounting up to 1.427 ms. Even when refresh is carried out during the T1 period, total write back can be accomplished within the T2 period. In the present embodiment, the DRAM has been described as having a unit of operation chip by chip but the DRAM may be operated in a unit of bank in accordance with the performance of the memory module or the construction of the memory chip. Further, the 64 ms refresh interval is 8 divided to define the WORK periods and REF. periods but by making the division finer, the memory capacity of the FIFO for holding data and addresses can be decreased. Conversely, by making the division coarser, the number of operations for switching the WORK and REF. periods can be decreased and therefore, the control circuit participating in the switching can be simplified.

Figure 12A:
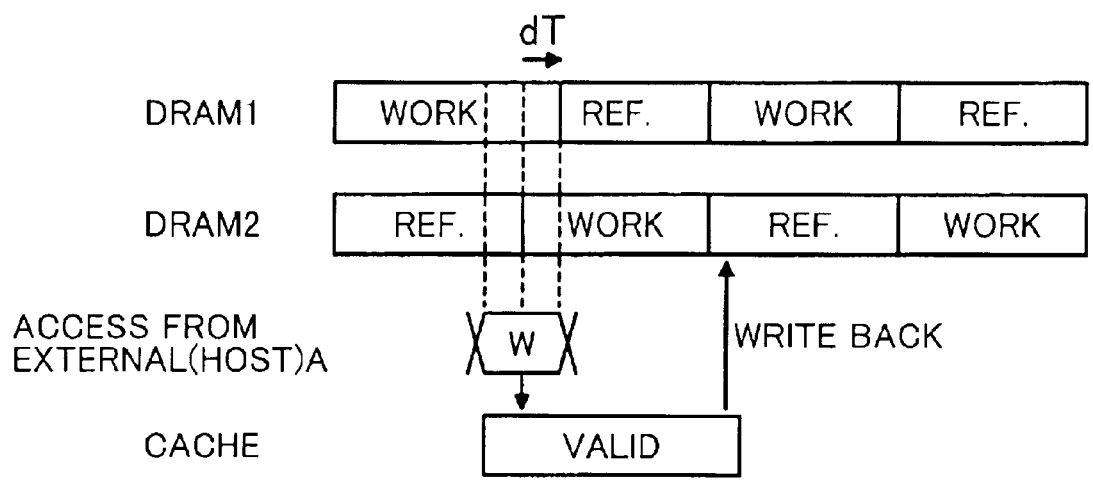
FIGS. 12A and 12B are diagrams for explaining take-over of access at the time of switching between WORK period and REF. period.
Figure 12B:
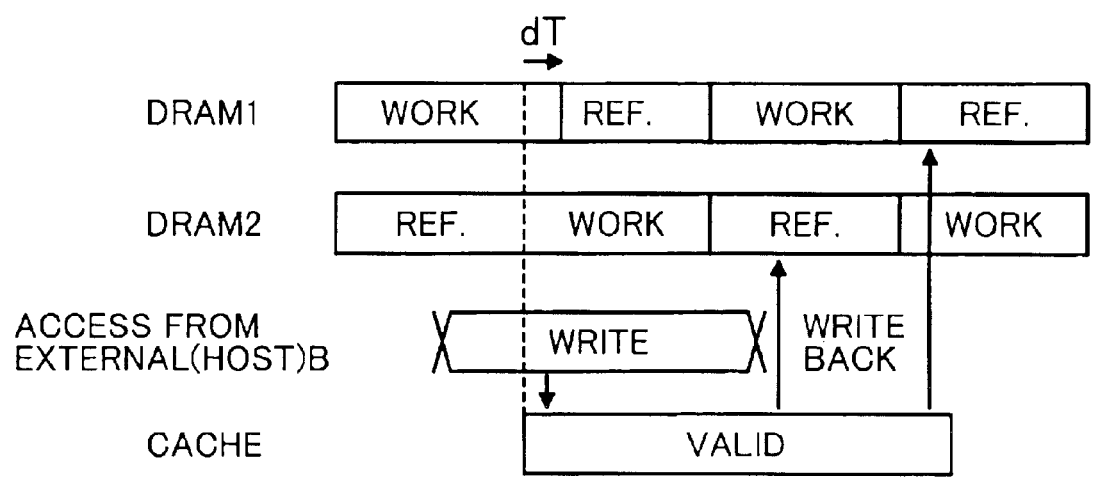

FIGS. 12A and 12B are diagrams for explaining how the CACHE operates. FIG. 12A shows a case where write access from external is applied immediately before switching between the WORK and REF. periods. Here, external access A is applied around the expiration of the WORK period of the DRAM1. In such a case, the WORK period of the DRAM1 is dT prolonged until the end of write access. Meanwhile, the DRAM2 undertakes the scheduled WORK period to wait for the end of write access without writing write data. Data not written in the DRAM2 is temporarily saved in the CACHE. When access to the same address as that saved in the CACHE occurs during the WORK period, read/write is not applied to the DRAM2 but is applied to the CACHE. In case the access is for writing, write is applied to the DRAM1 undertaking the REF. period via the FIFO as usually. The data held in the CACHE is written back during the REF. period following the expiration of the WORK period of the DRAM2. Upon completion of the write back, the contents of the CACHE is cleared. In case the access is for reading, the WORK period of the DRAM1 is dT prolonged merely until the end of the access.

FIG. 12B shows a case where one access operation is applied to continue in excess of the WORK period and REF. period and a case where the continuation cannot be covered by the extension period dT. External access B started when the DRAM1 undertakes the WORK period exceeds the extension time dT to keep continuing during the next REF. period. In this case, the access is taken over to the CACHE and the DRAM1 starts to undertake the REF. period. The DRAM2 comes into the WORK period on schedule and takes the wait condition. In the case of read access, data is taken over from the DRAM1 to the CACHE. In the case of write access, when the continuing access ends, data written in the CACHE is written back to the DRAM1 and DRAM2. Write back is executed at the time that each DRAM comes into the REF. period. Upon completion of write back at both the DRAM's, the contents of the CACHE is cleared. By using the CACHE in this manner, access over the WORK and REF. periods and access exceeding one or plural turns of the WORK period can be processed.

Figure 13:
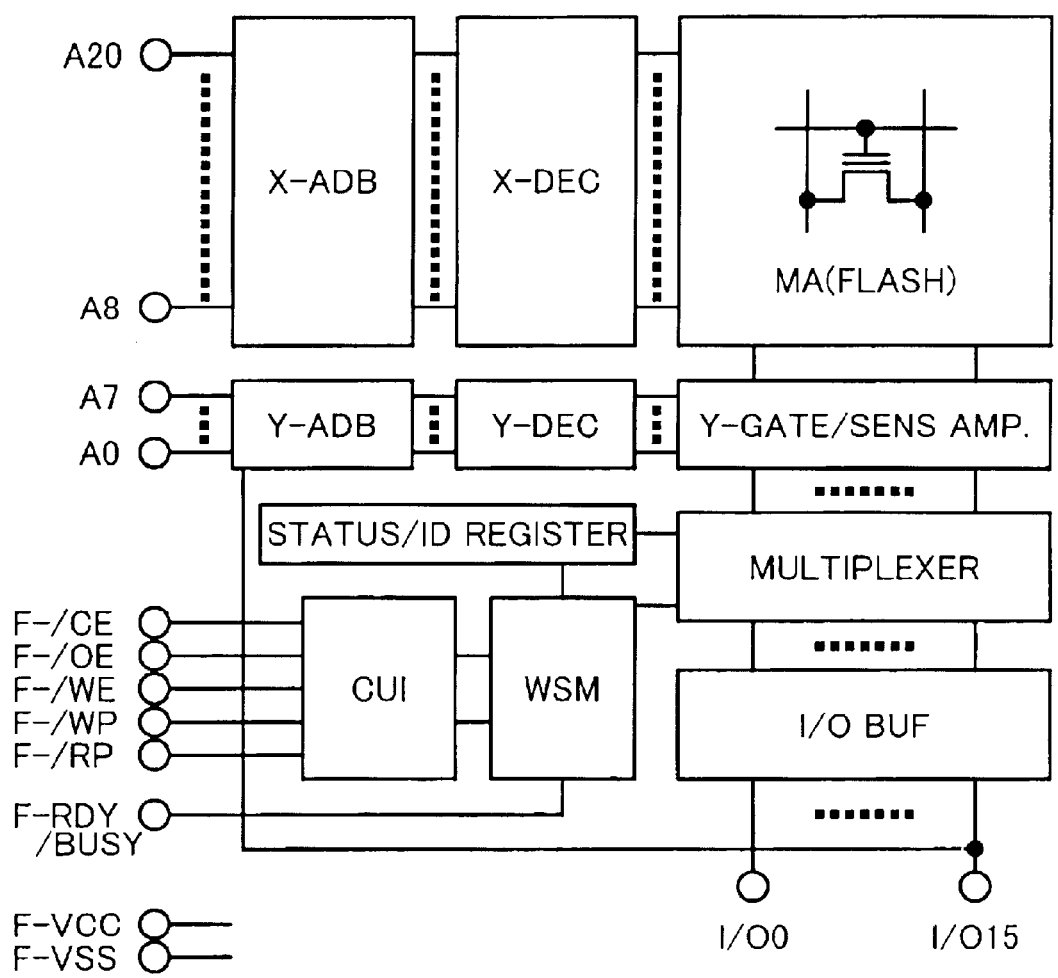
FIG. 13 is a block diagram showing an example of the construction of a flash memory.

FIG. 13 shows an example of the construction of the CHIP1 (FLASH) in the present embodiment. The CHIP1 (FLASH) includes an X address buffer X-ADB, an X decoder X-DEC, a memory array MA (FLASH), a Y address buffer Y-ADB, a Y decoder Y-DEC, a Y gate (column switch) and sense amplifier circuit Y-GATE/SENS AMP., a status/ID holding register STATUS/ID REG, a multiplexer MULTIPLEXER, a data input/output buffer I/O BUF, a write state machine WSM and a command user interface CUI. The CHIP1 operates similarly to the FLASH memory conventionally used in general. A memory module according to the present embodiment can be constructed of this CHIP1 (FLASH).

Figure 14:
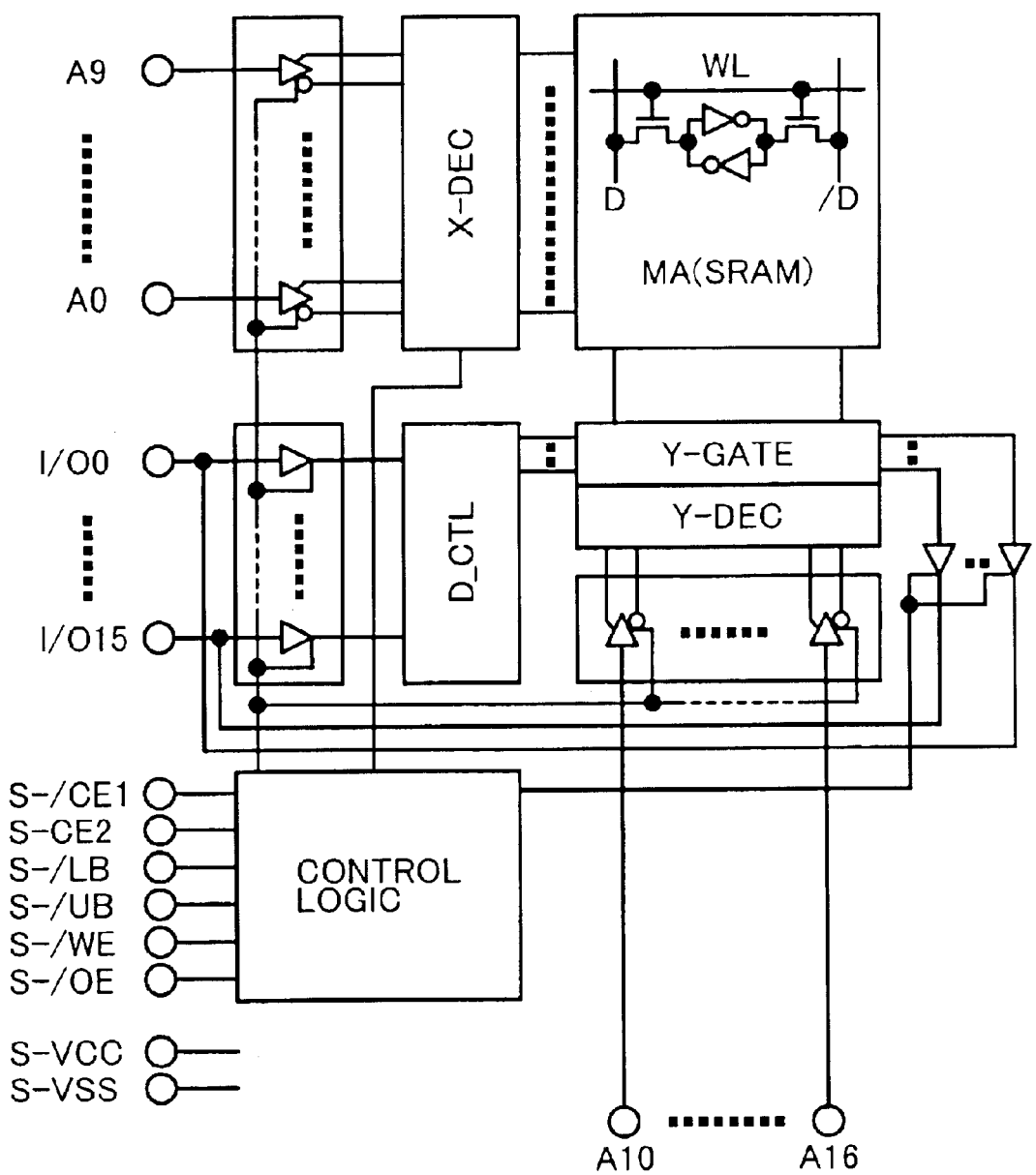
FIG. 14 is a block diagram showing an example of the construction of an SRAM.

FIG. 14 shows an example of the construction of the SRAM in the present embodiment. The SRAM includes an X decoder X-DEC, a memory array MA (SRAM), a Y gate Y-GATE, a Y decoder Y-DEC, an input data control circuit D_CTL, a control circuit CONTROL LOGIC and an input/output buffer for individual signal lines. This SRAM is a general, so-called asynchronous SRAM. The memory module according to the present embodiment can be constructed of this SRAM.

Figure 15:
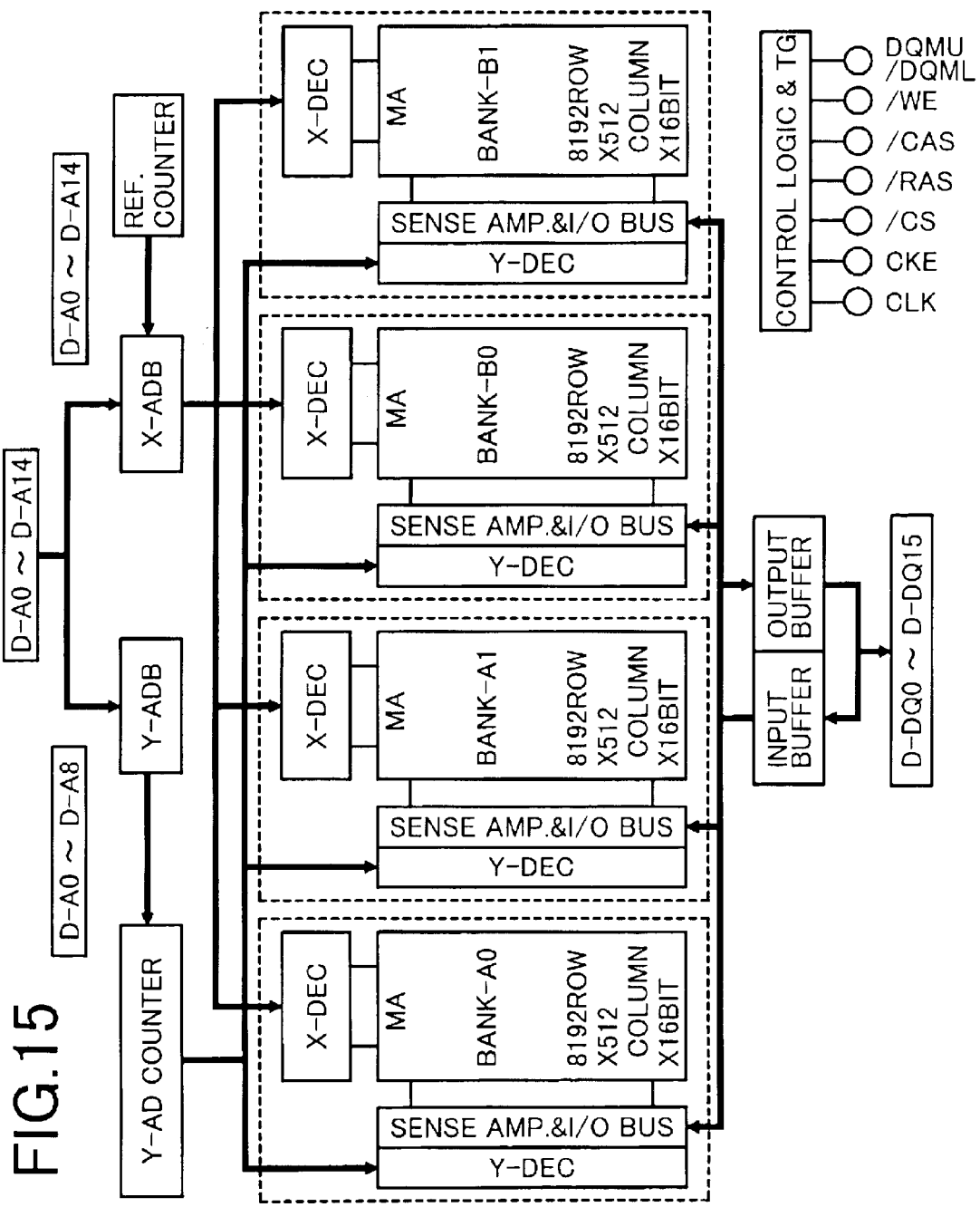
FIG. 15 is a block diagram showing an example of the construction of the DRAM.

FIG. 15 shows an example of the construction of the DRAM in the present embodiment. The DRAM includes an X address buffer X-ADB, a refresh counter REF. COUNTER, X decoders X-DEC's, memory arrays MA's, a Y address buffer Y-ADB, a Y address counter Y-AD COUNTER, Y decoders Y-DEC's, sense amplifier circuits and Y gates (column switches) SENSE AMP.& I/O BUSES, an input data buffer circuit INPUT BUFFER, an output data buffer circuit OUTPUT BUFFER and a control circuit and timing generating circuit CONTROL LOGIC & TG. Each memory array MA has a plurality of memory cells provided at intersections of a plurality of word lines and a plurality of data lines. Each of the memory cells is a so-called 1C1T type memory cell in which a capacitor and a MISFET are connected in series. As the DRAM used in the present invention, a general-purpose SDRAM conventionally used may be utilized. In particular, the SDRAM has 4 independently operational memory banks (or memory blocks) and address input terminals and data input/output terminals are shared by these banks and utilized on time-sharing base bank by bank. The memory module according to the present invention can be constructed of this DRAM.

Figure 16:
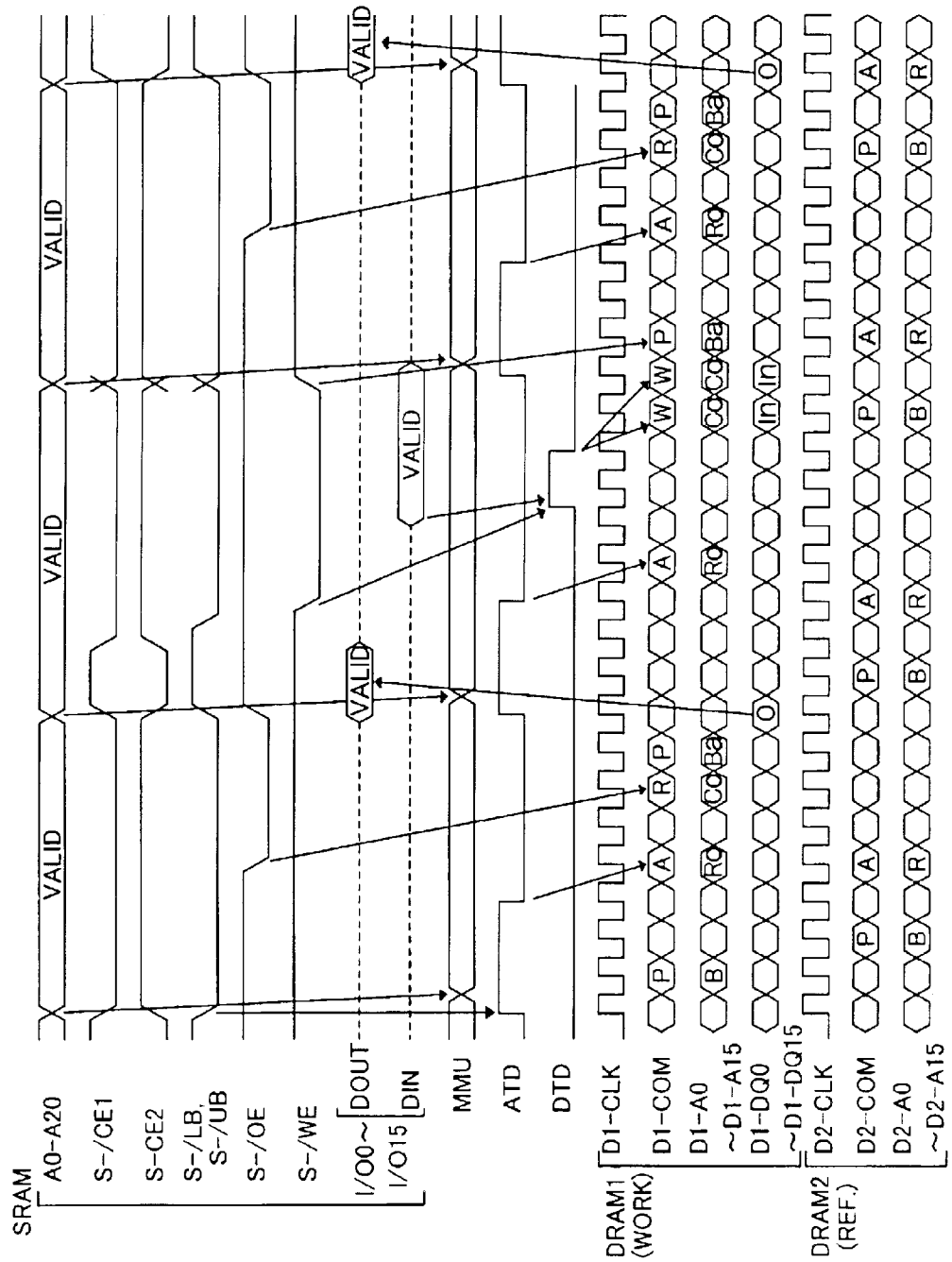
FIG. 16 is a timing chart in the memory module to which the invention is applied.

FIG. 16 shows an example of operation waveforms in the memory module according to the invention. Signals A~A20, S-/CE1, S-CE2, S-/LB, S-/UB, S-/OE and S-/WE are inputted to the memory module and they are interface signals of a so-called asynchronous SRAM. Data input/output signals I/O0~I/O15 are indicative of data input and output which are separately designated by DIN and DOUT. The MMU circuit, ATD circuit and DTD circuit deliver output signals designated by MMU, ATD and DTD, respectively. Clocks supplied to the DRAM are generally designated by D-CLK and command signals supplied to the DRAM are generally designated by D-COM. The DRAM has address lines D-A0~D-A15 and I/O lines D-DQ0~D-DQ15.

Firstly, read access to be performed initially will be described. When receiving inputs of addresses A0~A20, the MMU circuit delivers converted addresses. The ATD circuit detects changes in addresses A0~A20 and changes in commands (S-/CE1, S-CE2, S-/LB, S-/UB, S-/OE, S-/WE) and when the addresses and commands are settled, it delivers a pulse. Responsive to this pulse, a bank active command A and a row address Ro are issued to the DRAM1 undertaking the WORK period, with the result that the DRAM1 is brought into a bank active state. Next, the control circuit responds to the fall of the S-/OE signal to issue a read command R and a column address Co. Data read out of the DRAM1 is delivered to the D-DQ0~D-DQ15 and after being once passed through the R/W BUFFER, delivered to the I/O0~I/O15.

An example of execution of write access is shown in the next cycle. In the case of write access as well, the fall of ATD signal takes an opportunity of issuing a bank active command A and a row address Ra as in the case of read access. Thereafter, the DTD circuit detects changes in IO0~I/O15 and commands (S-/CE1, S-CE2, S-/LB, S-/UB, S-/OE, S-/WE) to deliver a pulse. Responsive to this pulse, a write command W and a column command Co are issued to execute a write operation. Since data to be written is settled at the rise of the S-/WE indicative of the end of write access, the issuance of the write command continues until the S-/WE rises. By virtue of this operation, even a case where the write data changes after the start of write cycle can be dealt with. In the operation example shown in FIG. 16, two write commands are issued sequentially and thereafter, the write operation ends in accordance with the rise of the S-/WE signal and a pre-charge command is issued. In addition, refresh is applied to the DRAM2 undertaking the REF. period and pre-charge command P and bank active command A are issued repetitively.

According to the embodiment described as above, a large-capacity memory module using an inexpensive general-purpose DRAM can be realized by taking over the SRAM interface method. In the control circuit (CTL_LOGIC) according to the invention, the DRAM is used but refresh necessary for the DRAM is executed by the control circuit (CTL_LOGIC), so that the like the SRAM, the DRAM can be used by leaving refresh out of consideration. Further, since refresh of the DRAM can be shielded from the outside of the memory module by holding data in duplication and adjusting the timing of refresh in the DRAM, there is no need of adjusting the timing in consideration of refresh when access to the present memory module is made. Accordingly, the memory module can be used similarly to the conventional memory module using only the SRAM and hence a memory module of large capacity can be used without changing the conventional system to advantage.

In addition, by narrowing the refresh interval of the DRAM, the DRAM can be operated at high temperatures and consequently, a memory module of a broad use temperature range can be realized. Meanwhile, by widening the refresh interval of the DRAM at low temperatures, power necessary for data holding can be reduced, thus making it possible to realize a memory module of less data holding power.

By virtue of the action of the power module PM, power source supply to part or the whole of the DRAM can be stopped to limit the memory area so as to reduce power necessary for data holding. Besides, power source supply to the control circuit may also be stopped to realize a memory module of more reduced data holding power. Furthermore, since in such a case the memory area for performing data holding can be set at will by means of the MMU, the memory module can be used widely in correspondence with various kinds of apparatus.

<Embodiment 2>

Figure 17:
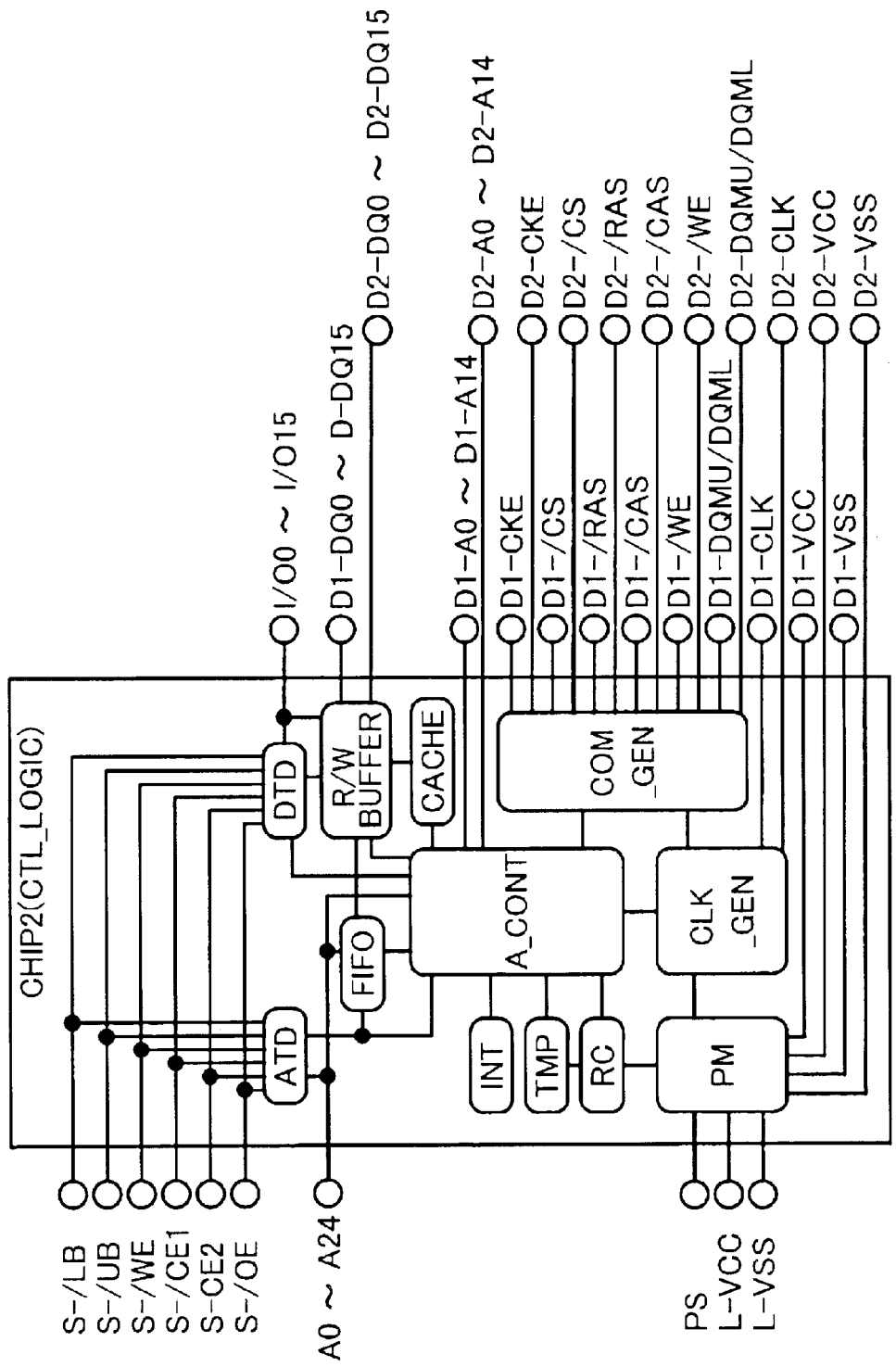
FIG. 17 is a block diagram showing another example of the construction of the CHIP2 in FIG. 1.

FIG. 17 shows another embodiment of the CHIP2 constituting the memory module in the present invention. A CHIP2 (CTL_LOGIC) in the present embodiment is comprised of a control circuit (CTL_LOGIC) including an ATD, a DTD, a FIFO, a R/W BUFFER, an A_CONT, a CACHE, an INT, a TMP, an RC, a PM, a CLK_GEN and a COM_GEN. The present CHIP2 differs from the CHIP2 shown in FIG. 2 in that the SRAM, access switch AS and MMU are not built in. Accordingly, execution of all access operations is applied to the DRAM.

Interface is set up to the CHIP2 (CTL_LOGIC) through the asynchronous SRAM method. A signal transmitted externally by the asynchronous SRAM method is converted by the CHIP2 and the CHIP2 is caused to access the DRAM. The CHIP2 controls data input/output and refresh operation.

Individual blocks of the control circuit operate as will be described below when read access is carried out. Firstly, an address inputted externally and commands detected by the ATD are sent to the A_CONT. From the sent address and commands, the A_CONT determines execution of access and instructs the COM_GEN to issue commands to the DRAM. Meanwhile, the A_CONT converts the received address into one for the DRAM and delivers it to the DRAM. The COM_GEN issues commands to the DRAM in synchronism with a clock generated by the CLK_GEN. The DRAM during the WORK period receiving the commands and address delivers data and the delivered data is transferred to the I/O0~I/O15 via the R/W BUFFER, thereby ending the read access.

In performing write access, an address inputted externally, commands detected by the ATD, commands detected by the DTD and data are sent to the A_CONT. From the sent address and commands, the A_CONT determines execution of access and instructs the COM_GEM to issue commands to the DRAM. The A_CONT converts the received address to one for the DRAM and delivers it to the DRAM. The COM_GEN issues commands to the DRAM in synchronism with a clock generated by the CLK_GEN. Data to be written is inputted from the I/O0~I/O15 and once held in the R/W BUFFER and thereafter, sent to the DRAM undertaking the WORK period so as to be written therein. Meanwhile, the written data and address are also held in the FIFO and write is also applied to the DRAM undertaking the REF. period.

Other operations are similar to those explained in connection with the first embodiment with the only exception that access to the DRAM is not carried out.

According to the embodiments described as above, the CHIP2 of a small area can be constructed without incorporating the SRAM, access switch AS and MMU and therefore, the large-capacity memory module can be realized inexpensively. Further, access to the DRAM can be carried out without routing through the operation of the access switch AS and MMU and therefore a fast and large-capacity memory module can be realized. Other advantages or beneficial effects attainable by the present embodiment are similar to those already explained in connection with the first embodiment.

<Embodiment 3>

Figure 18:
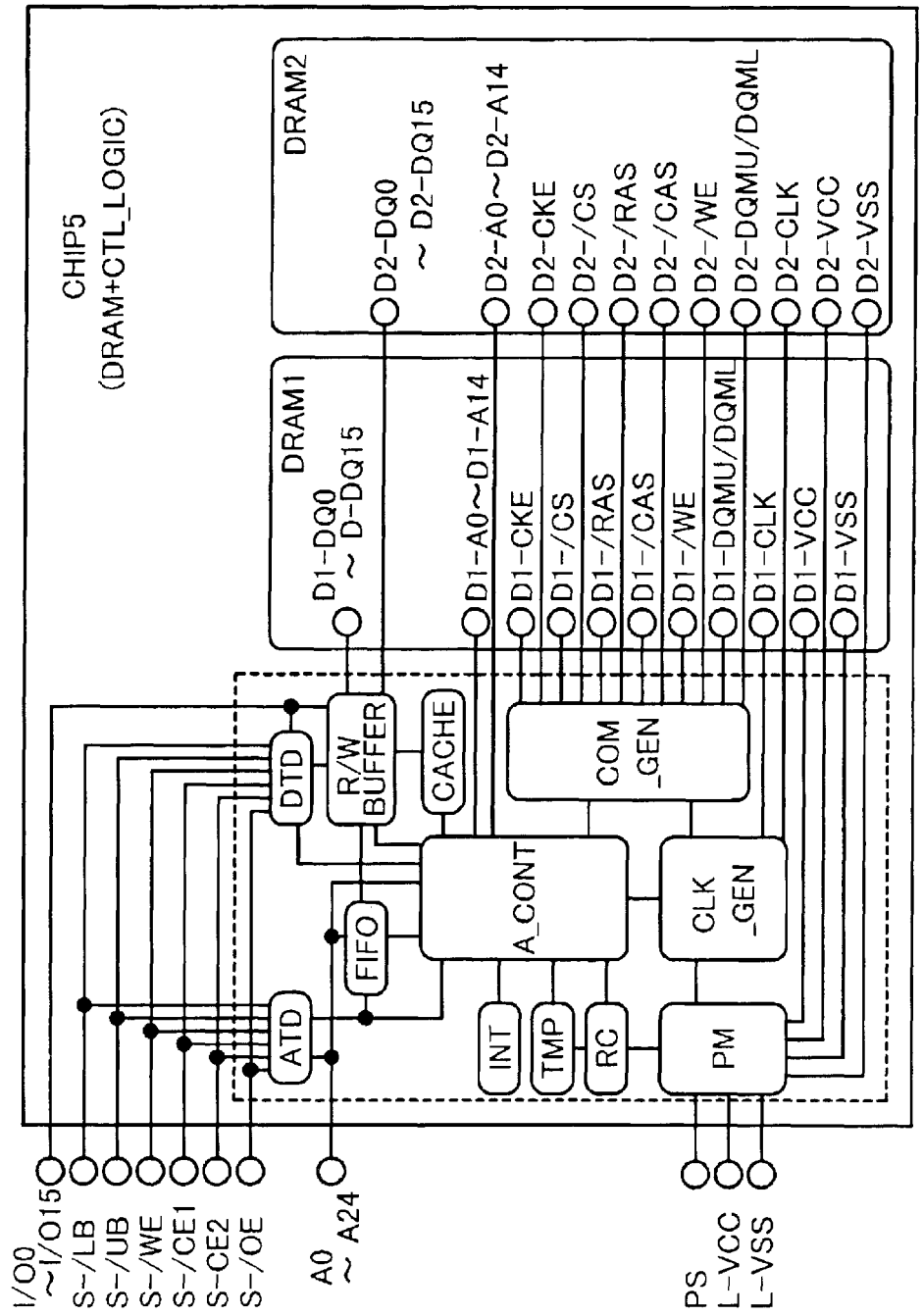
FIG. 18 is a diagram showing an embodiment of a large-capacity memory based on an asynchronous SRAM interface method utilizing the DRAM according to the invention.

FIG. 18 shows a third embodiment of the CHIP2 and CHIP3 constituting the memory module according to the invention. A CHIP5 (DRAM+CTL_LOGIC) in the present embodiment includes a control circuit (CTL_LOGIC) and a DRAM. Components ATD, DTD, FIFO, R/W BUFFER, A_CONT, CACHE, INT, TMP, RC, PM, CLK_GEN and COM_GEN constituting the control circuit and the DRAM are integrated on a single chip. Thus, the present embodiment is constructed by mounting the DRAM to the CHIP2 shown in FIG. 17. Its operation will be described below.

The address transition detector circuit (ATD) detects changes in address signals and command signals to deliver pulses. The data transition detector circuit (DTD) detects changes in data signal and command signals to deliver pulses. The R/W BUFFER temporarily saves data for read and write of the DRAM. The FIFO is a first-in first-out buffer circuit adapted to temporarily hold data to be written in the DRAM and its address. The initial circuit (INT) initializes the DRAM when power source supply to the DRAM is started. The temperature measurement module (TMP) detects temperatures and delivers a signal complying with a detected temperature to the refresh counter (RC) and the access controller (A_CONT). The refresh counter generates an address for refresh in compliance with the refresh interval of the DRAM. The refresh counter also responds to an output signal from the temperature measurement module (TMP) to change the refresh interval in compliance with a temperature. The power module (PM) controls the power supply to the control circuit (CTL_LOGIC) and DRAM of CHIP5 and the power source. The clock generator (CLK_GEN) generates a clock and supplies it to the DRAM and control circuit (CTL_LOGIC). The command generator (COM_GEN) generates commands necessary for access to the DRAM. The access controller (A_CONT) controls operation of the whole of CHIP5 (DRAM+CTL_LOGIC) and generates an address for accessing the DRAM. For memory-accessing the CHIP5 (DRAM+CTL_LOGIC), interface is set up through the so-called asynchronous SRAM method. When a signal is transmitted from external through the asynchronous SRAM method, the control circuit converts it and then accesses the DRAM.

Operation of the individual blocks of the control circuit will be described below by taking a case where read access to the DRAM is carried out. Firstly, addresses inputted externally are sent to the A_CONT. Changes in the addresses and command signals are detected by the ATD which in turn delivers pulses to the A_CONT. From the sent addresses and commands, the A_CONT determines execution of access and instructs the COM_GEN to issue commands to the DRAM undertaking the WORK period. The A_CONT also converts the received address to one for the DRAM and delivers it to the DRAM undertaking the WORK period. The COM_GEN issues the commands to the DRAM undertaking the WORK period in synchronism with the clock generated by the CLK_GEN. The DRAM receiving the commands and address delivers data, which in turn is transferred to the I/O0~I/O15 via the R/W BUFFER, thus ending the read access.

Next, a case where write access to the DRAM is carried out will be described. Externally inputted addresses, commands detected by the ATD, commands detected by the DTD and data are sent to the A_CONT. From the sent addresses and commands, the A_CONT determines execution of access and instructs the COM_GEN to issue the commands to the DRAM undertaking the WORK period. Also, the A_CONT converts the received address into one for the DRAM and delivers it to the DRAM undertaking the WORK period. The COM_GEN issues the commands to the DRAM undertaking the WORK period in synchronism with the clock generated by the CLK_GEN. Data to be written is inputted from the IO0~I/O15, saved in the R/W BUFFER temporarily and thereafter sent to the DRAM undertaking the WORK period so as to be written therein. Additionally, the data to be written and address are once saved in the FIFO and thereafter are written to the DRAM undertaking the REF. period as well.

Power source supplied to the DRAM is controlled by the power module (PM). In an apparatus mounted with the memory module, reduction of current consumption complying with the operating state is sometimes desired. In such a case, the power module complies with the command signal PS to stop refresh carried out by the refresh counter to thereby reduce power needed for refresh of the DRAM.

If further reduction of power consumption is desired, power source supplied to part of the CHIP5, that is, part or the whole of DRAM can be interrupted. In that case, the power module responds to the command signal PS delivered out of the apparatus to stop power supply to the D-VCC applied to the DRAM.

For furthermore reduction of power consumption, the power module can comply with the command signal PS to stop also the power source supply to a part of CHIP5 (DRAM+CTL_LOGIC) which participates in memory access to the DRAM. In this state, it is possible to connect the power source to, for example, only the ATD of CHIP5 (DRAM+CTL_LOGIC) to place it in wait condition. Excepting the above, operation is similar to that explained in connection with embodiment 1.

According to the embodiment described as above, a memory module of large capacity using the DRAM can be realized by taking over the SRAM interface method. The present embodiment has advantages as below in addition to those already explained in connection with the first and second embodiments.

More particularly, according to the present embodiment, the number of parts of the memory module can be decreased to simplify the assembling process for the module and eventually reduce costs. Further, the present embodiment can be used as the memory module and besides can stand alone so as to be used as a large-capacity SRAM. By using the inexpensive DRAM while taking over the SRAM interface method, a small-area chip for interchange of large-capacity SRAM's can be realized.

<Embodiment 4>

Figure 19A:
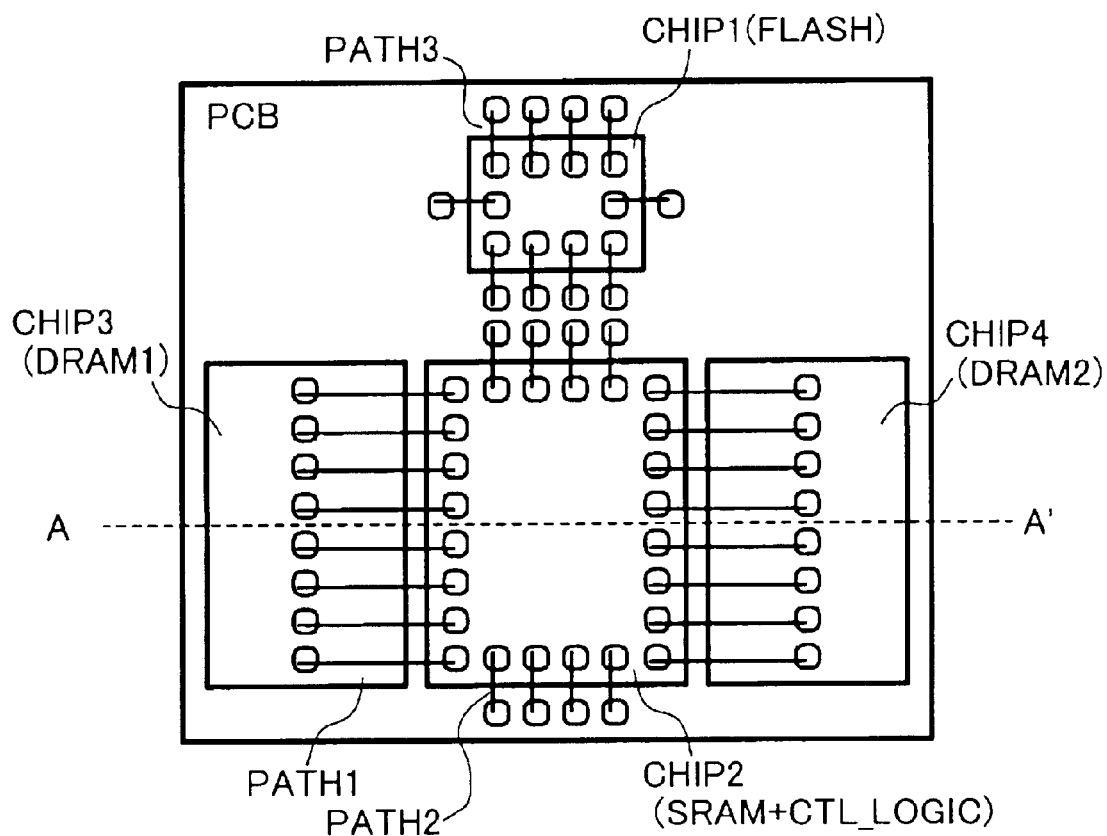
FIGS. 19A and 19B are diagrams showing an example of mounting of the memory module according to the invention.
Figure 19B:
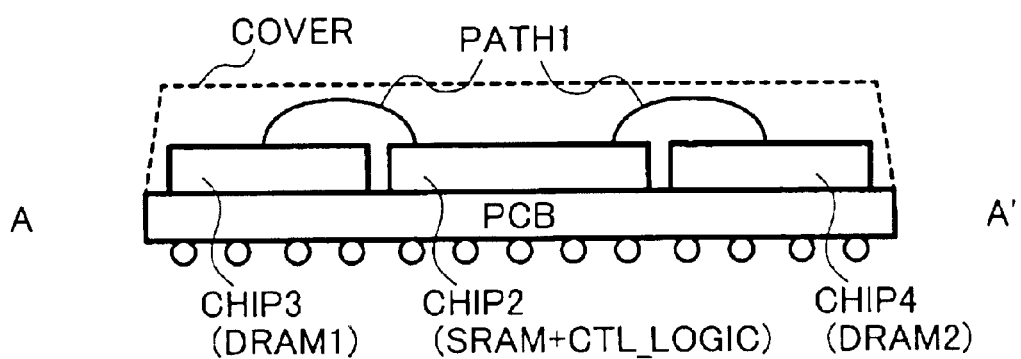

FIGS. 19A and 19B show a fourth embodiment of the memory module according to the present invention. FIG. 19A illustrates a top view and FIG. 19B illustrates a sectional view. In the present memory module, a CHIP1 (FLASH), a CHIP2 (SRAM+CTL_LOGIC), a CHIP3 (DRAM1) and a CHIP4 (DRAM2) are mounted on a substrate (for example, a printed circuit board PCB made from a glass epoxy substrate) packaged in an apparatus by a ball grid array. Although not particularly limited, a so-called bare chip for general-purpose DRAM having signal and power source pads aligned in line in the center of the chip is used for the CHIP3 and CHIP4. The CHIP1 is connected to bonding pads on the substrate by bonding wires (PATH3) and the CHIP2 is connected to bonding pads on the substrate by bonding wires (PATH2). The CHIP3 and CHIP4 are connected to the CHIP2 by bonding wires (PATH1). The top surface of substrate mounting the chip is molded with resin to protect the individual chips and connection wiring lines. A cover (COVER) of metal, ceramics or resin may be used to cover the resin mold. In FIG. 1, terminals designated by blank circle (address signal terminals A0~A24, data input/output terminals I/O0~I/O15, control signal terminals for CHIP2, control signal terminals for CHIP1 and power source terminal) are connected to bump electrodes of BGA for delivery/reception of signals to/from the outside of the package.

Since, in the present embodiment, the bare chips are directly mounted on the printed circuit board PCB, a memory module having a small mount area can be constructed. In addition, the individual chips are arranged closely to each other and therefore, the wiring length between adjacent chips can be shortened. By making uniform the wiring between chips and the wiring between each chip and the substrate by using the bonding wire method, the memory module can be fabricated through a reduced number of steps. Further, by directly wiring the chips to each other by bonding wire to reduce the number of bonding pads on the substrate and the number of bonding wire lines, the memory chip can be fabricated through a small number of steps. Since bare chips for general-purpose DRAM which can be made in mass production are used, the memory module can be supplied stably at low costs. With the resin cover used, a more robust memory module can be constructed. With a ceramic or metal cover used, a memory module that is highly strong and besides good at heat sink and shield effect can be constructed.

Figure 20A:
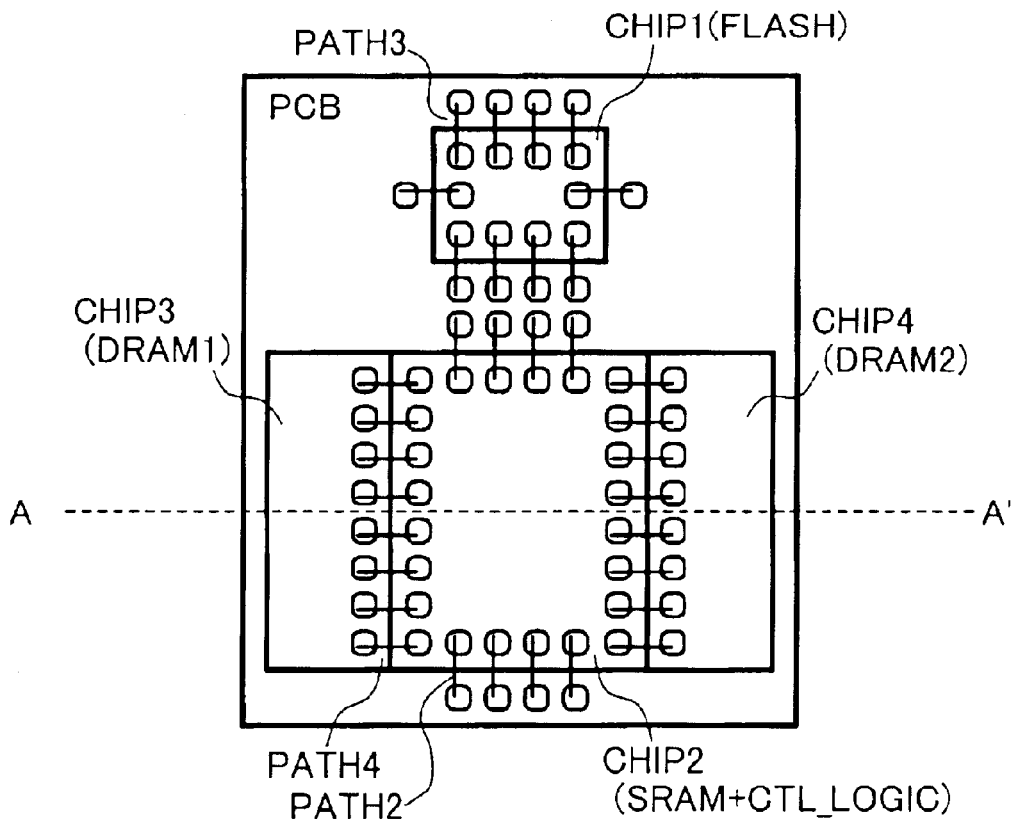
FIGS. 20A and 20B are diagrams showing another example of mounting of the memory module according to the invention.
Figure 20B:
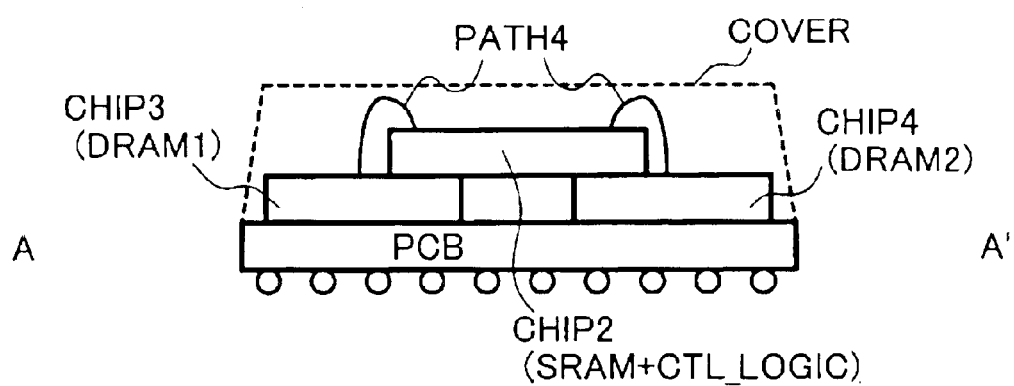

FIGS. 20A and 20B show a modified example of the memory module of FIGS. 19A and 19B according to the invention. FIG. 20A shows a top view and FIG. 20B shows a sectional view. In this example, a CHIP2 (SRAM+CTL_LOGIC) is mounted on CHIP3 and CHIP4. Further, a PATH4 is used for wiring the CHIP2 to the CHIP3 or CHIP4. Through this mount method, the area of printed circuit board PCB can be reduced. Moreover, by virtue of the wiring PATH4 for laminated chips, the length of wiring lines can be reduced, with the result that reliability of wiring can be improved and noise radiation to the outside can be reduced.

Advantages or beneficial effects attained by the embodiments of the invention set forth so far are as follows. Firstly, by controlling access to the DRAM by means of the controller, the large-capacity memory that need not be refreshed externally can be realized. Secondly, by setting the data hold area and the work area and controlling power source supply to them, respectively, the memory module of less data hold current can be realized. Thirdly, by mounting a plurality of semiconductor chips in a single molded device, a memory module of small mount area can be provided.

It should be further understood by those skilled in the art that the foregoing description has been made on embodiments of the invention and that various changes and modifications may be made in the invention without departing from the spirit of the invention and scope of the appended claims.

What is claimed is:

1. A semiconductor device, comprising:
   a first chip including a first memory comprised of a plurality of first memory cells each having a first capacitor and a first MISFET, a plurality of first nodes for receiving first access signals for said first memory, and a first control logic for controlling an operation of the first memory;
   a second chip including a second memory comprised of a plurality of second memory cells each having a second capacitor and a second MISFET, a plurality of second nodes for receiving second access signals for said second memory, and a second control logic for controlling an operation of the second memory; and
   a third chip including a memory controller comprised of a plurality of third nodes connected to said plurality of first nodes to supply the first access signals for said first chip, a plurality of fourth nodes connected to said plurality of second nodes to supply the second access signals for said second chip, and a plurality of fifth nodes for receiving external access signals, wherein said memory controller delivers a first access signal so as to access said first memory when receiving the external access signal during a first period, and delivers a second access signal so as to access said second memory when receiving the external access signal during a second period, wherein said memory controller outputs the first access signals indicating a refresh operation command to said plurality of first nodes of said first memory regardless of the external access signals.

wherein said memory controller outputs the second access signals indicating the refresh operation command to said plurality of second nodes of said second memory regardless of the external access signals, wherein each of said first memory and said second memory is a dynamic random access memory chip, and wherein said first chip, said second chip and said third chip are different chips.

2. A semiconductor device according to claim 1, wherein during said first period, said memory controller responds to said external access signal to enable a read or write command signal for said first memory to be delivered as said first access signal and enable a refresh command signal for refreshing said second memory to be delivered as said second access signal; and during said second period, said memory controller responds to said external access signal to enable a read or write command signal for said second memory to be delivered as said second access signal and enable a refresh command signal for refreshing said first memory to be delivered as said first access signal.

3. A semiconductor device according to claim 2, wherein each of said first memory and second memory has a period for storing the same information in duplication.

4. A semiconductor device according to claim 1, wherein when write of data in said first memory occurs during said first period, said memory controller transcripts during said first period said write data to a second memory cell of corresponding address of said second memory in accordance with a predetermined procedure.

5. A semiconductor device according to claim 1, wherein said memory controller generates said first and second periods alternately on time sharing base.

6. A semiconductor device according to claim 1, wherein said semiconductor device alternately repeats said first period serving as a period for permission of read/write of said first memory and a period for refresh of said second memory and said second period serving as a period for refresh of said first memory and a period for permission of read/write of said second memory.

7. A semiconductor device according to claim 1, wherein said third chip further includes an SRAM memory, and said external access signals are supplied to said plurality of fifth nodes of said third chip with an SRAM interface method.

8. A semiconductor device according to claim 1 further comprising a molded device including therein said first, second and third chips, wherein said molded device has a plurality of first electrodes electrically connecting to said third chip, and a plurality of second electrodes connected to said plurality of first electrodes to electrically connect to the outside of said molded device.

9. A semiconductor device according to claim 8, wherein said molded device includes a substrate;

said first electrodes are provided on a first major surface of said substrate and said first, second and third chips are mounted on said first major surface;

said first major surface of said substrate is covered with a molding material; and said second electrodes are provided on a second major surface of said substrate that is on the side opposite to said first major surface.

10. A semiconductor device according to claim 9, wherein said first, second and third chips are molded with resin.

11. A semiconductor device according to claim 1 further comprising a fourth chip including a non-volatile memory and a plurality of fifth nodes for receiving external access signals for said non-volatile memory, address signal terminals for receiving address signals from the outside of said semiconductor device, and a data input/output terminal for input/output of data to/from the outside of said semiconductor device, wherein when said first and second memories of said first and second chips are accessed, a predetermined address and predetermined data are supplied via the address signal terminal and the data input/output terminal, and when the non-volatile memory block of said fourth chip is accessed, a predetermined address and predetermined data are supplied via the address signal terminal and the data input/output terminal.

12. A semiconductor device according to claim 11 further comprising a plurality of first control signal terminals supplied with signals for controlling access to said first and second memories, a plurality of second control signal terminals supplied with signals for controlling access to said non-volatile memory, and a plurality of power source terminals for said first to fourth semiconductor chips.

13. A semiconductor device according to claim 11, wherein each of said first and second chips performs read/write by a command synchronous with a clock, and said fourth chip is a flash memory chip.

14. A semiconductor devices comprising:

a first DRAM chip;

a second DRAM chip;

a chip including a memory controller comprised of a plurality of first nodes connected to said first DRAM chip to supply first access signals for said first DRAM chip, a plurality of second nodes adapted to supply second access signals for said second DRAM chip, and a plurality of third nodes for receiving external access signals;

a non-volatile memory chip;

a plurality of address signal terminals connected in common to said non-volatile memory chip and said chip including said memory controller to receive address signals from the outside of said semiconductor device; and a plurality of data input/output terminals connected in common to said non-volatile memory chip and said chip including said memory controller to perform input/output of data from the outside of said semiconductor device, wherein said memory controller outputs the first access signals and the second access signals indicating a refresh operation command regardless of the external access signals, and wherein said first DRAM chip and said second DRAM chip are different chips.

15. A semiconductor device according to claim 14 further comprising a plurality of first control signal terminals to which signals for controlling access to said first and second DRAM chips are supplied as control signals to said memory controller, and a plurality of second control signal terminals to which signals for controlling access to said non-volatile memory are supplied.

16. A semiconductor device according to claim 15 further comprising a molded device including therein said first DRAM chip, said second DRAM chip and said chip including said memory controller, wherein said plurality of address signal terminals, said plurality of data input/output terminals, said plurality of first control signal terminals and said plurality of second control signal terminals are exposed to the outside of said molded device.

17. A semiconductor device according to claim 16, wherein access from the outside of said semiconductor device to said first DRAM chip and second DRAM chip is carried out through an SRAM interface method and in the access from the outside of said semiconductor device, a busy period attributable to refresh of said first and second DRAM chips does not occur.

18. A semiconductor device according to claim 14, wherein said first and second memories have each a duplicate address space and store the same information in duplication.

* * * * *

UNITED STATES PATENT AND TRADEMARK OFFICE
CERTIFICATE OF CORRECTION

PATENT NO. : 6,928,512 B2
DATED : August 9, 2005
INVENTOR(S) : Kazushige Ayukawa et al.

It is certified that error appears in the above-identified patent and that said Letters Patent is hereby corrected as shown below:

<u>Title page,</u>
Item [22], PCT Filed: should read -- June 7, 2002 --.

Signed and Sealed this

Twenty-first Day of March, 2006

JON W. DUDAS
*Director of the United States Patent and Trademark Office*